(12) United States Patent
Khang et al.

(10) Patent No.: US 12,457,818 B2
(45) Date of Patent: Oct. 28, 2025

(54) IMAGE SENSOR

(71) Applicant: SAMSUNG ELECTRONICS CO., LTD., Suwon-si (KR)

(72) Inventors: Donghoon Khang, Hwaseong-si (KR); Kwangyoung Oh, Hwaseong-si (KR); Chongkwang Chang, Hwaseong-si (KR); Jinyoung Kim, Suwon-si (KR); Taehun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 551 days.

(21) Appl. No.: 17/515,769

(22) Filed: Nov. 1, 2021

(65) Prior Publication Data

US 2022/0149089 A1 May 12, 2022

(30) Foreign Application Priority Data

Nov. 10, 2020 (KR) .................. 10-2020-0149213

(51) Int. Cl.
*H10F 39/00* (2025.01)
*H04N 25/79* (2023.01)
(Continued)

(52) U.S. Cl.
CPC .......... *H10F 39/807* (2025.01); *H04N 25/79* (2023.01); *H10F 39/018* (2025.01);
(Continued)

(58) Field of Classification Search
CPC .......... H01L 27/1463; H01L 27/14623; H01L 27/1464; H01L 27/14643; H10F 39/8033;
(Continued)

(56) References Cited

U.S. PATENT DOCUMENTS 7,795,656 B2    9/2010 Moon
7,902,618 B2 *  3/2011 Mao ................ H01L 27/1463
                                              257/292
(Continued)

FOREIGN PATENT DOCUMENTS

CN    108573986 A    9/2018
CN    109638026 A    4/2019
(Continued)

*Primary Examiner* — Sophia T Nguyen

(74) *Attorney, Agent, or Firm* — Sughrue Mion, PLLC

(57) ABSTRACT

An image sensor includes: a semiconductor substrate having a first side and a second side opposite to each other; a plurality of photoelectric regions arranged in the semiconductor substrate in a first direction and a second direction, perpendicular to each other, in a first region of the semiconductor substrate; and a first separation structure disposed between the plurality of photoelectric regions in the first region of the semiconductor substrate. The first separation structure includes a lower separation structure and an upper separation structure disposed above the lower separation structure, and the first separation structure includes a linear portion located between the plurality of photoelectric regions and extending in the first direction, wherein, in a cross-sectional structure of the linear portion of the first separation structure in the first direction, at least one of an upper surface of the lower separation structure and a lower surface of the upper separation structure has a wavy shape.

17 Claims, 31 Drawing Sheets

(51) Int. Cl.
*H10F 39/12* (2025.01)
*H10F 39/18* (2025.01)

(52) U.S. Cl.
CPC ......... *H10F 39/182* (2025.01); *H10F 39/199* (2025.01); *H10F 39/8053* (2025.01); *H10F 39/8057* (2025.01); *H10F 39/8063* (2025.01); *H10F 39/809* (2025.01); *H10F 39/811* (2025.01)

(58) Field of Classification Search
CPC .. H10F 39/8027; H10F 39/151; H10F 39/191; H10F 39/199; H10F 39/014; H10F 39/18; H10F 39/182; H10F 39/192; H10F 39/184; H10F 39/807; H10F 39/011; H10F 39/809
See application file for complete search history.

(56) References Cited

U.S. PATENT DOCUMENTS

| | | | |
|---|---|---|---|
| 8,378,399 B2* | 2/2013 | Maeda | H01L 27/1464 257/292 |
| 8,405,097 B2* | 3/2013 | Huang | H10F 39/813 257/E31.127 |
| 9,136,409 B2* | 9/2015 | Tachikawa | H10F 77/14 |
| 9,431,452 B1* | 8/2016 | Liu | H01L 27/14645 |
| 9,455,284 B2* | 9/2016 | Park | H01L 27/14612 |
| 9,466,629 B2 | 10/2016 | Yoon et al. | |
| 9,911,777 B2* | 3/2018 | Lee | H10F 39/807 |
| 9,923,009 B1 | 3/2018 | Hsiung et al. | |
| 9,942,461 B2* | 4/2018 | Kim | H01L 27/14612 |
| 9,986,192 B1 | 5/2018 | Tai et al. | |
| 10,177,191 B1* | 1/2019 | Cheng | H10F 39/026 |
| 10,304,885 B1* | 5/2019 | Chu | H10F 39/807 |
| 10,608,033 B2 | 3/2020 | Lee et al. | |
| 10,644,051 B2 | 5/2020 | Nah et al. | |
| 10,763,291 B2* | 9/2020 | Shimotsusa | H10F 39/807 |
| 11,088,188 B2* | 8/2021 | Cheng | H10F 39/8063 |
| 11,158,664 B2* | 10/2021 | Huang | H10F 39/806 |
| RE48,878 E* | 1/2022 | Koo | H01L 27/14614 |
| 11,367,745 B2* | 6/2022 | Cheng | H10F 71/121 |
| 11,380,729 B2* | 7/2022 | Chen | H10F 39/8063 |
| 11,450,702 B2* | 9/2022 | Lee | H01L 27/14609 |
| 11,532,658 B2* | 12/2022 | Lin | H10F 39/182 |
| 11,824,073 B2* | 11/2023 | Cheng | H01L 27/14621 |
| 12,211,880 B2* | 1/2025 | Kim | H10F 39/807 |
| 2007/0045513 A1* | 3/2007 | Lee | H10F 39/807 250/208.1 |
| 2009/0057801 A1* | 3/2009 | Goushcha | H01L 27/1443 257/E31.055 |
| 2009/0224346 A1* | 9/2009 | Iida | H01L 27/14603 257/E31.127 |
| 2009/0317933 A1* | 12/2009 | Park | H01L 27/1464 257/E31.127 |
| 2010/0123069 A1* | 5/2010 | Mao | H01L 27/1463 438/57 |
| 2012/0025199 A1 | 2/2012 | Chen et al. | |
| 2012/0104533 A1* | 5/2012 | Hirata | H10F 39/807 257/446 |
| 2012/0276679 A1* | 11/2012 | Wu | H01L 27/1463 257/E31.127 |
| 2012/0292727 A1* | 11/2012 | Huang | H10F 39/813 257/E31.127 |
| 2013/0285181 A1* | 10/2013 | Lin | H01L 27/1463 257/E31.127 |
| 2014/0239362 A1* | 8/2014 | Koo | H01L 27/1463 257/294 |
| 2014/0246707 A1* | 9/2014 | Koo | H01L 27/1464 257/230 |
| 2014/0263962 A1* | 9/2014 | Ahn | H01L 27/1464 250/208.1 |
| 2014/0327051 A1* | 11/2014 | Ahn | H01L 31/18 438/69 |
| 2015/0035029 A1* | 2/2015 | Ikeda | H01L 27/14607 257/292 |
| 2015/0243694 A1* | 8/2015 | Ihara | H01L 27/14621 257/443 |
| 2015/0243696 A1* | 8/2015 | Chien | H10F 39/8057 257/435 |
| 2015/0311241 A1* | 10/2015 | Park | H01L 27/14636 257/432 |
| 2015/0372031 A1* | 12/2015 | Yoon | H01L 27/1463 257/446 |
| 2016/0172391 A1* | 6/2016 | Ihara | H01L 27/14627 438/70 |
| 2016/0204144 A1* | 7/2016 | Lee | H01L 27/1464 257/432 |
| 2016/0365374 A1* | 12/2016 | Park | H01L 23/481 |
| 2017/0062513 A1* | 3/2017 | Koo | H01L 27/14614 |
| 2017/0104019 A1* | 4/2017 | Jung | H01L 27/1462 |
| 2017/0207259 A1* | 7/2017 | Yun | H10F 39/8063 |
| 2017/0207263 A1* | 7/2017 | Park | H01L 27/14614 |
| 2017/0287975 A1* | 10/2017 | Koo | H01L 27/14614 |
| 2018/0211986 A1* | 7/2018 | Lee | H01L 27/14689 |
| 2018/0254294 A1* | 9/2018 | Cheng | H10F 39/807 |
| 2018/0286895 A1* | 10/2018 | Watanabe | H10F 39/8063 |
| 2018/0331159 A1* | 11/2018 | Lee | H10K 30/82 |
| 2018/0337211 A1* | 11/2018 | Su | H10F 39/8063 |
| 2019/0006408 A1* | 1/2019 | Fang | H10F 39/182 |
| 2019/0043901 A1 | 2/2019 | Honda et al. | |
| 2019/0103437 A1* | 4/2019 | Su | H10F 39/8063 |
| 2019/0103504 A1* | 4/2019 | Yamashita | H10F 77/959 |
| 2019/0131327 A1* | 5/2019 | Chou | H01L 27/1464 |
| 2019/0132506 A1* | 5/2019 | Cheng | H04N 25/703 |
| 2019/0148434 A1* | 5/2019 | Hsu | H10F 39/8057 257/432 |
| 2019/0165026 A1* | 5/2019 | Kuo | H10F 39/807 |
| 2019/0206917 A1* | 7/2019 | Nakajiki | H10F 39/8053 |
| 2019/0252425 A1* | 8/2019 | Ogawa | H01L 27/14636 |
| 2019/0296060 A1* | 9/2019 | Oh | H04N 25/77 |
| 2020/0006410 A1 | 1/2020 | Wu et al. | |
| 2020/0027915 A1* | 1/2020 | Hsieh | H01L 31/02366 |
| 2020/0052022 A1* | 2/2020 | Cheng | H10F 39/8063 |
| 2020/0075661 A1* | 3/2020 | Cheng | H10F 39/184 |
| 2020/0083264 A1* | 3/2020 | Cheng | H10F 39/807 |
| 2020/0127025 A1* | 4/2020 | Lim | H04N 25/79 |
| 2020/0219911 A1* | 7/2020 | Hur | H01L 27/14603 |
| 2020/0243580 A1 | 7/2020 | Wu et al. | |
| 2020/0328238 A1* | 10/2020 | Shim | H10F 39/8063 |
| 2020/0381468 A1* | 12/2020 | Long | H01L 27/14627 |
| 2021/0126031 A1* | 4/2021 | Yamaguchi | H01L 27/1463 |
| 2021/0183920 A1* | 6/2021 | Lee | H10F 39/014 |
| 2021/0210532 A1* | 7/2021 | Hung | H01L 27/14614 |
| 2021/0288192 A1* | 9/2021 | Yokogawa | H10F 39/199 |
| 2021/0313360 A1* | 10/2021 | Lee | H01L 27/1464 |
| 2021/0335861 A1* | 10/2021 | Cheng | H01L 21/76224 |
| 2021/0335864 A1* | 10/2021 | Ogawa | H01L 27/14603 |
| 2021/0351209 A1* | 11/2021 | Lee | H01L 27/14643 |
| 2021/0351220 A1* | 11/2021 | Jang | H01L 27/14636 |
| 2021/0384247 A1* | 12/2021 | Cheng | H10F 39/811 |
| 2021/0391361 A1* | 12/2021 | Huang | H10F 39/024 |
| 2021/0399093 A1* | 12/2021 | Zheng | H10F 39/807 |
| 2022/0045110 A1 | 2/2022 | Fujita et al. | |
| 2022/0123032 A1 | 4/2022 | Lee et al. | |
| 2022/0149089 A1* | 5/2022 | Khang | H01L 27/14645 |
| 2022/0173143 A1* | 6/2022 | Kim | H10F 39/807 |
| 2022/0310677 A1* | 9/2022 | Cheng | H10F 77/306 |
| 2022/0320160 A1* | 10/2022 | Liu | H10F 39/014 |
| 2023/0036152 A1* | 2/2023 | Kim | H10F 39/199 |
| 2023/0057815 A1* | 2/2023 | Yamaguchi | H01L 27/14621 |
| 2023/0154956 A1* | 5/2023 | Kuo | H10F 39/182 257/432 |
| 2023/0197753 A1* | 6/2023 | Iwabuchi | H10F 39/8037 |
| 2023/0308755 A1* | 9/2023 | Cheng | H10F 39/8063 |
| 2025/0006764 A1* | 1/2025 | Mizuta | H10F 39/12 |

FOREIGN PATENT DOCUMENTS

| | | |
|---|---|---|
| CN | 110120399 A | 8/2019 |
| JP | 6744943 B2 | 8/2020 |
| KR | 10-0825805 B1 | 4/2008 |

(56) References Cited

FOREIGN PATENT DOCUMENTS

| KR | 10-2017-0042940 A | 4/2017 |
| KR | 10-2022-0019895 A | 2/2022 |
| KR | 10-2022-0050385 A | 4/2022 |

* cited by examiner

IMAGE SENSOR

CROSS-REFERENCE TO RELATED APPLICATION

This application claims priority from Korean Patent Application No. 10-2020-0149213 filed on Nov. 10, 2020 in the Korean Intellectual Property Office, the disclosure of which is incorporated herein by reference in its entirety.

BACKGROUND

The disclosure relates to an image sensor. Image sensor chips for capturing images and converting the images into electrical signals may be used not only in electronic devices for general consumers such as digital cameras, mobile phone cameras, portable camcorders, or the like, but also in cameras installed in vehicles, security devices, robots, or the like. Since the image sensor chips may be required to be miniaturized and to have high resolution, research has been conducted to meet the requirements for miniaturization and high resolution of the image sensor chips.

SUMMARY

Example embodiments in this disclosure provide miniaturized image sensors.

According to an example embodiment, there is provided an image sensor that may include: a semiconductor substrate having a first side and a second side opposite to the first side; a plurality of photoelectric regions arranged in the semiconductor substrate in a first direction and a second direction, perpendicular to each other; and a separation structure disposed in the semiconductor substrate to separate the plurality of photoelectric regions, wherein the separation structure includes a lower separation structure disposed at the first side of the semiconductor substrate and an upper separation structure disposed at the second side of the semiconductor substrate, wherein a length between a lower end of the lower separation structure and an upper end of the lower separation structure is greater than a length between a lower end of the upper separation structure and an upper end of the upper separation structure, wherein the upper end of the upper separation structure is coplanar with the second side of the semiconductor substrate, wherein in at least a portion of the separation structure, a first vertical central axis between both lateral surfaces of the lower separation structure is not vertically aligned with a second vertical central axis between both lateral surfaces of the upper separation structure, and wherein a height difference between the lower end of the upper separation structure and the upper end of the lower separation structure is greater than a width of the lower separation structure.

According to an example embodiment, there is provided an image sensor that may include: a semiconductor substrate having a first side and a second side opposite to the first side; a plurality of photoelectric regions arranged in the semiconductor substrate in a first direction and a second direction, perpendicular to each other, in a first region of the semiconductor substrate; and a first separation structure disposed between the plurality of photoelectric regions in the first region of the semiconductor substrate. The first separation structure includes a lower separation structure and an upper separation structure disposed above the lower separation structure, and the first separation structure includes a linear portion located between the plurality of photoelectric regions and extending in the first direction, wherein, in a cross-sectional structure of the linear portion of the first separation structure in the first direction, at least one of an upper surface of the lower separation structure and a lower surface of the upper separation structure has a wavy shape.

According to an example embodiment, there is provided an image sensor that may include: a first chip structure including a lower substrate, a lower wiring structure disposed above the lower substrate, and a lower insulating layer disposed above the lower substrate and covering the lower wiring structure; and a second chip structure disposed above the first chip structure. The second chip structure may include: a semiconductor substrate having a first side opposite to the first chip structure and a second side opposing the first side; a plurality of photoelectric regions arranged in a first region of the semiconductor substrate in a first direction and a second direction, perpendicular to each other; a first reference region and a second reference region, disposed in a second region of the semiconductor substrate and spaced apart from each other; a back side insulating layer disposed above the second side of the semiconductor substrate; color filters disposed above the back side insulating layer and overlapping the plurality of photoelectric regions; microlenses disposed above the color filters; a light blocking pattern disposed above the back side insulating layer and overlapping the first reference region and the second reference region; a first separation structure disposed in the first region of the semiconductor substrate and surrounding each of the plurality of photoelectric regions; a second separation structure disposed in the second region of the semiconductor substrate and surrounding each of the first reference region and the second reference region; and an upper wiring structure and an upper insulating layer, disposed between the first side of the semiconductor substrate and the first chip structure, wherein each of the first separation structure and the second separation structure includes a lower separation structure and an upper separation structure disposed above the lower separation structure, the first separation structure includes a linear portion located between the plurality of photoelectric regions and extending in the first direction, wherein, in a cross-sectional structure of the linear portion of the first separation structure in the first direction, at least one of an upper surface of the lower separation structure and a lower surface of the upper separation structure is repeatedly arranged in the first direction and includes a first inclined surface and a second inclined surface, having different angles of inclination.

BRIEF DESCRIPTION OF DRAWINGS

The above and other aspects, features, and advantages will be more clearly understood from the following detailed description, taken in conjunction with the accompanying drawings, in which.

DETAILED DESCRIPTION

Hereinafter, example embodiments of the disclosure will be described with reference to the accompanying drawings.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present. Like numerals refer to like elements throughout.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
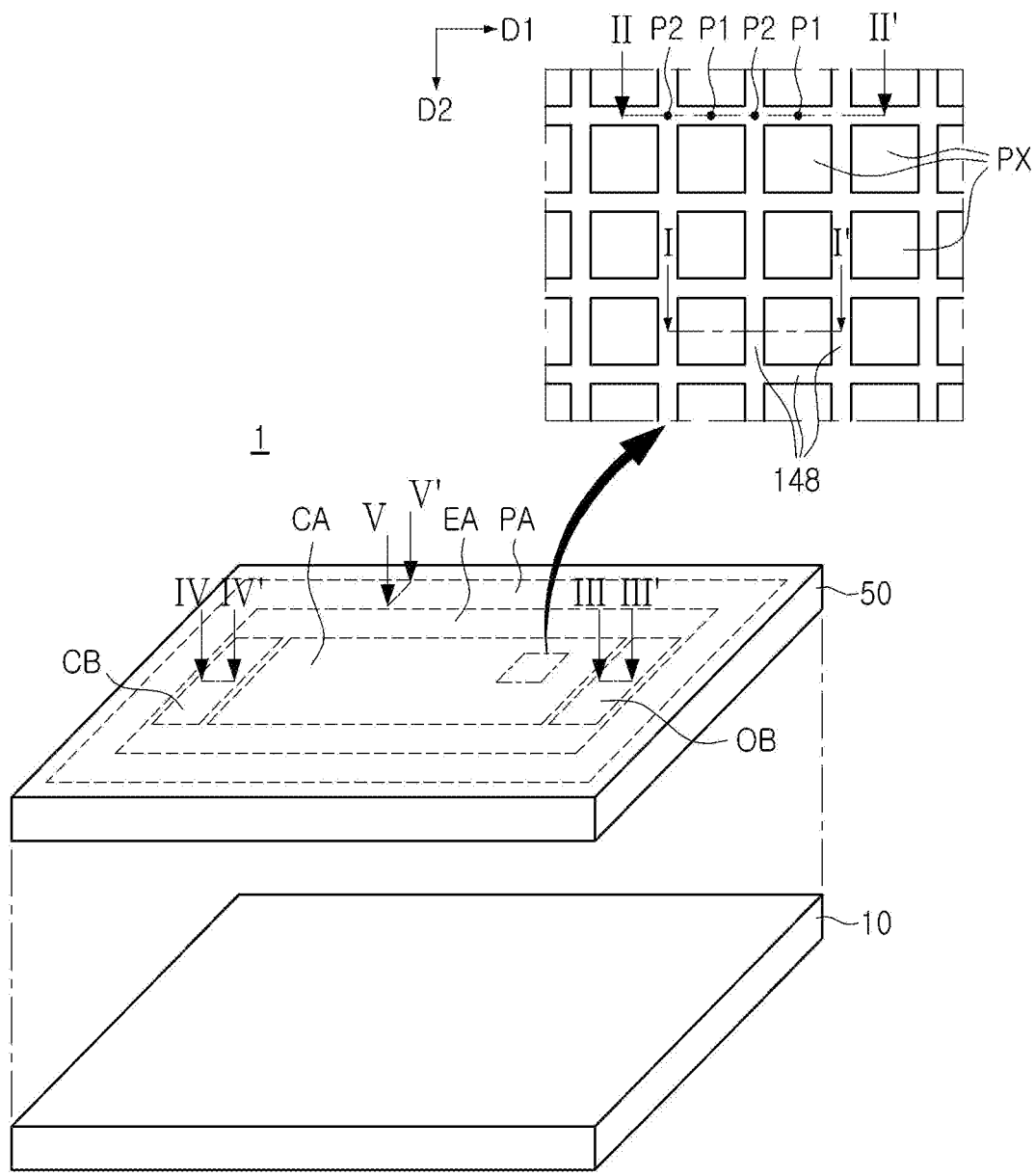
FIG. 1 is an exploded perspective view schematically illustrating an image sensor according to an embodiment.

An image sensor according to an embodiment will be described with reference to FIG. 1. FIG. 1 is an exploded perspective view schematically illustrating an image sensor according to an embodiment.

Referring to FIG. 1, an image sensor 1 according to an embodiment may include a lower chip 10 and an upper chip 50 on the lower chip 10. The lower chip 10 may be referred to as a first chip structure, and the upper chip 50 may be referred to as a second chip structure.

In an example embodiment, the image sensor 1 may include a first region (CA of FIG. 1), a second region (EA of FIG. 1), and a third region (PA of FIG. 1).

In an example embodiment, the third region PA may be disposed on at least one side of a central region including the first region CA and the second region EA. For example, the third region PA may be disposed on both sides of the central region including the first region CA and the second region EA, or may be disposed to surround the central region. The second region EA may be disposed on at least one side of the first region CA. For example, the second region EA may be disposed on either side of the first region CA, may be disposed on both sides of the first region CA, or may be disposed to surround the first region CA.

In an example embodiment, the first region CA may include an active pixel sensor array region, the second region EA may include an optical black region OB and a chip-connection region CB, and the third region PA may include a pad region in which input/output pads are disposed. The first region CA may be a region to which light is incident, the optical black region OB of the second region EA may be a region to which light is not incident, and the chip-connection region CB of the second region EA may be a region electrically connecting a lower wiring structure of the lower chip 10 to an upper wiring structure of the upper chip 50. In embodiments, the optical black region OB and the chip-connection region CB may be arranged in various shapes.

Hereinafter, an example of a cross-sectional structure of the first region CA of the image sensor 1 will be described with reference to FIGS. 2A, 2B, and 3, an example of a cross-sectional structure of the optical black region OB of the second region EA of the image sensor 1 will be described with reference to FIG. 12A, an example of a cross-sectional structure of the chip-connection region CB of the second region EA of the image sensor 1 will be described with reference to FIG. 12B, and an example of a cross-sectional structure of the third region PA of the image sensor 1 will be described with reference to FIG. 12C.

First, an example of a cross-sectional structure of the first region CA of the image sensor 1 will be described with reference to FIGS. 2A, 2B and 3. FIG. 2A may be a cross-sectional view schematically illustrating FIG. 1, taken along line I-I', FIG. 2B may be a partially enlarged view schematically illustrating 'portion A' of FIG. 2A, and FIG. 3 may be a partially enlarged cross-sectional view taken along line II-II' of FIG. 1.

Referring to FIGS. 1, 2A, 2B, and 3, the lower chip 10 may be a logic semiconductor chip, and the upper chip 50 may be an image sensor chip including a plurality of pixel regions PX.

In an example embodiment, the lower chip 10 may include a lower substrate 15 having a first side 15$s$1 and a second side 15$s$2, opposite to each other, a lower isolation layer 20$s$ disposed above the first side 15$s$1 of the lower substrate 15 and defining a lower active region 20$a$, lower device 26$g$ and 26$a$ and a lower wiring structure 32, disposed above the first side 15$s$1 of the lower substrate 15, and a lower insulating layer 40 disposed above the first side 15$s$1 of the lower substrate 15 and covering the lower device 26$g$ and 26$a$ and the lower wiring structure 32.

In an example embodiment, the lower substrate 15 may be a semiconductor substrate, for example, a single crystal silicon substrate.

In an example embodiment, the first side 15$s$1 of the lower substrate 15 may be defined as an upper surface of the lower active region 20$a$.

In an example embodiment, the lower devices 26$a$ and 26$g$ may include a circuit transistor including a lower gate 26$g$ and a lower source/drain region 26$a$ formed next to the lower gate 26$g$ and in the lower active region 20$a$.

The plurality of pixel regions PX of the upper chip 50 may include first photoelectric regions 150$a$. For example, the first photoelectric regions 150$a$ may generate and accumulate electric charges corresponding to an incident tube. For example, the first photoelectric regions 150$a$ may include a photodiode, a phototransistor, a photo gate, a pinned photo diode (PPD), and a combination thereof. The first photoelectric regions 150$a$ may be referred to as a photoelectric conversion region, a photoelectric conversion element or a photoelectric conversion device.

The upper chip 50 may include a semiconductor substrate 105 having a first side 105$s$1 and a second side 105$s$2, opposite to each other, an upper isolation layer 108$s$ disposed above the first side 105$s$1 of the semiconductor substrate 105 and defining an upper active region 108$a$, an upper device 112 and an upper wiring structure 121, disposed above the first side 105$s$1 of the semiconductor substrate 105, and an upper insulating layer 125 disposed above the first side 105$s$1 of the semiconductor substrate 105 and covering the upper device 112 and the upper wiring structure 121.

The first photoelectric regions 150$a$ may be formed in the semiconductor substrate 105, and may be spaced apart from each other.

The first side 105$s$1 of the semiconductor substrate 105 and the first side 15$s$1 of the lower substrate 15 may oppose each other with the upper insulating layer 125 and the lower insulating layer 40 therebetween.

The upper device 112 may include a transfer gate TG and a floating diffusion region FD. The transfer gate TG may have a shape of a vertical transistor gate including a portion extending from the first side 105s1 of the semiconductor substrate 105 into the semiconductor substrate 105. The floating diffusion region FD may be formed in the upper active region 108a and next to the transfer gate TG.

The upper device 112 may further include a transistor 116 including a second gate 116a and a second impurity region 116b formed in the upper active region 108a and next to the second gate 116a. The transistor 116 may be at least one of a source follower transistor, a reset transistor, or a selection transistor.

The upper wiring structure 121 may include multilayer wires, located at different height levels, and vias electrically connecting the multilayer wires to the upper device 112.

The upper insulating layer 125 may be disposed above the first side 105s1 of the semiconductor substrate 105, and may cover the upper device 112 and the upper wiring structure 121.

The upper insulating layer 125 may be formed as a multilayer including different types of insulating layers. For example, the upper insulating layer 125 may be formed as a multilayer structure including at least two or more of a silicon oxide layer, a low-k dielectric layer, and a silicon nitride layer.

In an example embodiment, the first photoelectric regions 150a may be photodiodes of the image sensor 1. For example, the first photoelectric regions 150a may be PN photodiodes.

In an example embodiment, the upper chip 50 may further include a first separation trench 127 passing through the semiconductor substrate 105, and a first separation structure 148 in the first separation trench 127.

In an example embodiment, the first separation structure 148 may be disposed between the first photoelectric regions 150a. The first separation structure 148 may be disposed to surround each of the first photoelectric regions 150a.

In an example embodiment, the upper chip 50 may further include a back side insulating layer 153 disposed above the second side 105s2 of the semiconductor substrate 105, color filters 172 disposed above the back side insulating layer 153, filter separation patterns 169 disposed between the color filters 172, and microlenses 175 disposed above the color filters 172.

The back side insulating layer 153 may include a plurality of layers 153a, 153b, and 153c, sequentially stacked. For example, the back side insulating layer 153 may include at least two of an aluminum oxide layer, a hafnium oxide layer, a silicon oxide layer, or a silicon nitride layer.

Figure 2A:
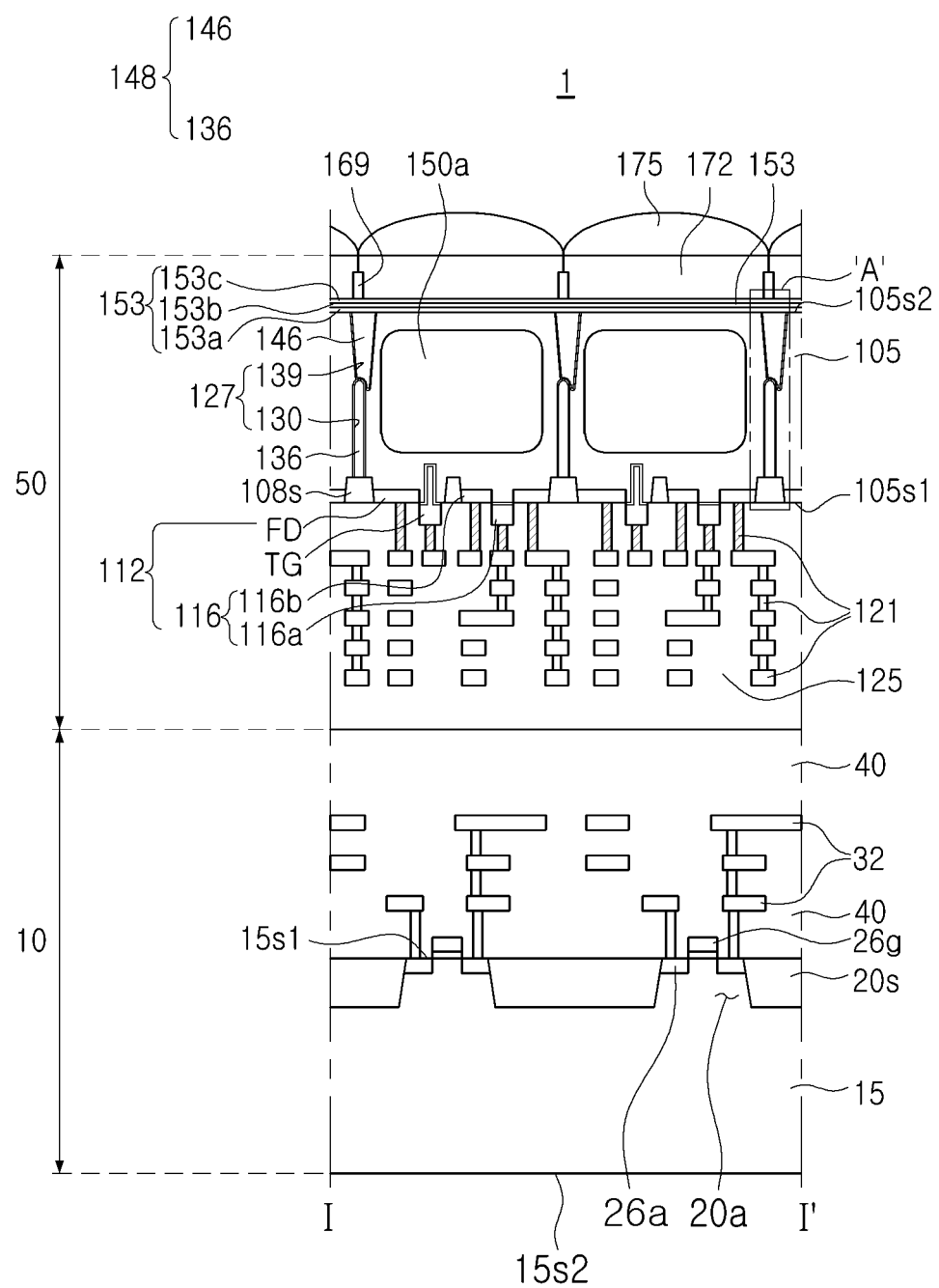
FIG. 2A is a cross-sectional view schematically illustrating an image sensor according to an embodiment.
Figure 2B:
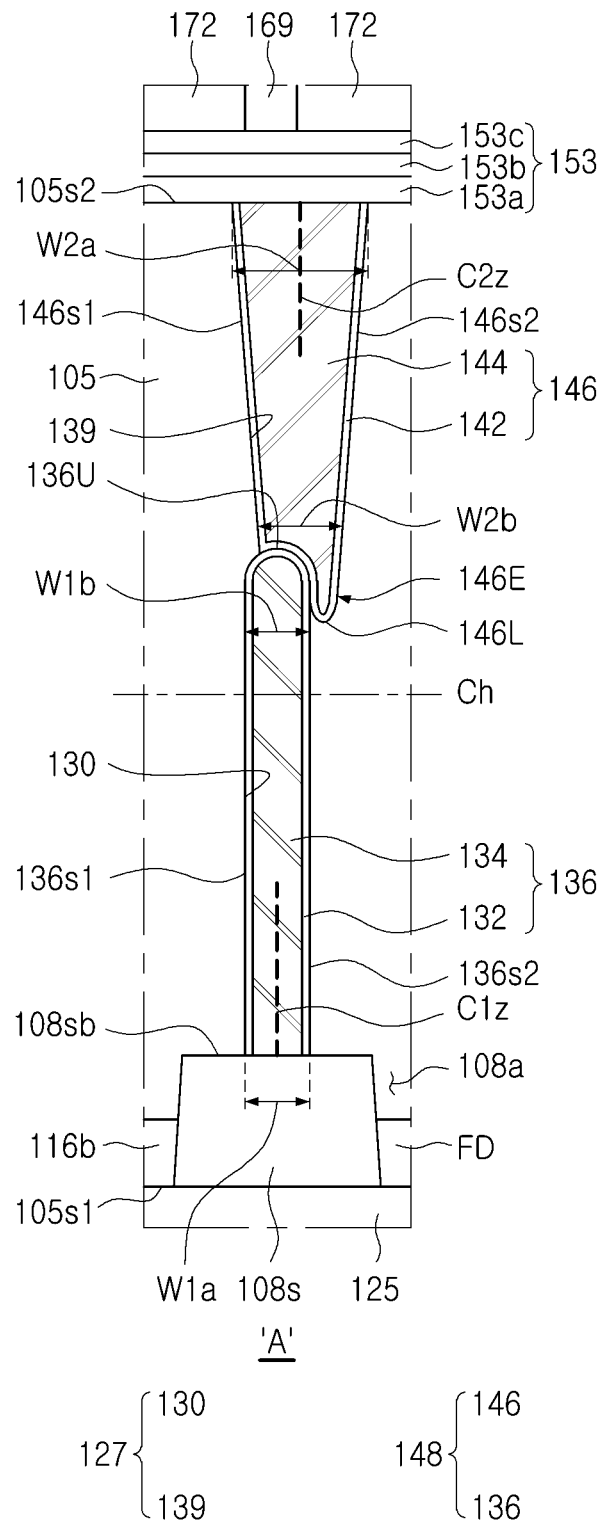
FIG. 2B is a partially enlarged cross-sectional view illustrating a portion of FIG. 2A.

FIG. 2B illustrates the first separation trench 127 and the first separation structure 148.

Referring to FIG. 2B, the first separation trench 127 may include a lower separation trench 130 extending in a direction from an upper surface 108sb of the upper isolation layer 108s toward the second side 105s2 of the semiconductor substrate 105, and an upper separation trench 139 extending in a direction from the second side 105s2 of the semiconductor substrate 105 toward the first side 105s1 of the semiconductor substrate 105.

The first separation structure 148 may include a lower separation structure 136 disposed in the lower separation trench 130, and an upper separation structure 146 disposed in the upper separation trench 139.

In an example embodiment, the lower separation structure 136 may be in contact with the upper isolation layer 108s.

In an example embodiment, the lower separation structure 136 may include a lower material pattern 134 and a lower material layer 132. At least a portion of the lower material layer 132 may be interposed between the lower material pattern 134 and the semiconductor substrate 105. The lower material layer 132 may further include a portion extending between the lower material pattern 134 and the upper separation structure 146 from the portion interposed between the lower material pattern 134 and the semiconductor substrate 105.

In an example embodiment, the lower material pattern 134 may include a polysilicon material, and the lower material layer 132 may include an insulating material. In an example embodiment, the lower material layer 132 may include a silicon oxide layer that may be formed by thermally oxidizing the semiconductor substrate 105. In another example, the lower material layer 132 may include a silicon oxide layer, a silicon oxynitride layer, a silicon nitride layer, or a high-k dielectric layer that may be formed to conformally cover an inner wall of the lower separation trench 130 by a deposition process.

In an example embodiment, the upper separation structure 146 may include an upper material pattern 144 and an upper material layer 142. At least a portion of the upper material layer 142 may be interposed between the upper material pattern 144 and the semiconductor substrate 105. The upper material layer 142 may further include a portion extending between the upper material pattern 144 and the lower separation structure 136 from the portion interposed between the upper material pattern 144 and the semiconductor substrate 105.

In an example embodiment, the upper material pattern 144 may include a polysilicon material, and the upper material layer 142 may include an insulating material. In an example embodiment, the upper material layer 142 may include a silicon oxide layer that may be formed by thermally oxidizing the semiconductor substrate 105. In another example, the upper material layer 142 may include a silicon oxide layer, a silicon oxynitride layer, a silicon nitride layer, or a high-k dielectric layer that may be formed to conformally cover an inner wall of the upper separation trench 140 by a deposition process.

In an example embodiment, the lower separation structure 136 may have a first lateral surface 136s1 and a second lateral surface 136s2, opposite to each other, and the upper separation structure 146 may have a first lateral surface 146s1 and a second lateral surface 146s2, opposite to each other.

In an example embodiment, in at least a portion of the first separation structure 148, a first vertical central axis C1z passing through a center between the first lateral surface 136s1 and the second lateral surface 136s2 of the lower separation structure 136 may not be vertically aligned with a second vertical central axis C2z passing through a center between the first lateral surface 146s1 and the second lateral surface 146s2 of the upper separation structure 146.

In an example embodiment, the upper separation structure 146 may include a portion overlapping and contacting the lower separation structure 136, and a portion not overlapping the lower separation structure 136 and not contacting the lower separation structure 136.

In an example embodiment, the upper separation structure 146 may further include a lower extension portion 146E not overlapping the lower separation structure 136 in a vertical direction and extending in a direction facing the first side 105s1 of the semiconductor substrate 105. The lower extension portion 146E may include a portion spaced apart from the second lateral surface 136s2 of the lower separation structure 136. The spaced apart portion may include a lower end 146L of the upper separation structure 146. The second lateral surface 136s2 of the lower separation structure 136 may overlap the upper separation structure 146.

In an embodiment, in FIG. 2B, a reference numeral 136U may be referred to as an upper surface of the lower separation structure 136, or a lower surface of the upper separation structure 146 contacting the upper surface of the lower separation structure 136. Alternatively, reference numeral 136U may be referred to as an upper end of the lower separation structure 136. Hereinafter, the reference numeral 136U will be described by referring to the upper end of the lower separation structure 136.

In an example embodiment, a first width W1a of the lower separation structure 136 adjacent to the first side 105s1 of the semiconductor substrate 105 may be greater than a second width W1b of the lower separation structure 136 adjacent to the upper separation structure 146. A third width W2a of the upper separation structure 146 adjacent to the second side 105s2 of the semiconductor substrate 105 may be greater than a fourth width W2b of the upper separation structure 146 adjacent to the lower separation structure 136.

In an example embodiment, each of the third width W2a and the fourth width W2b may be greater than the first width W1a. Each of the third width W2a and the fourth width W2b may be greater than the second width W1b.

In an example embodiment, a difference between the third width W2a and the fourth width W2b may be greater than a difference between the first width W1a and the second width W1b.

In an example embodiment, each of the first lateral surface 136s1 and the second lateral surface 136s2 of the lower separation structure 136 may have an angle of inclination of a substantially vertical direction. In another example, when viewed based on the cross-sectional structure of FIG. 2B, each of the first lateral surface 136s1 and the second lateral surface 136s2 of the lower separation structure 136 may have a positive angle of inclination. For example, a width of the lower separation structure 136 may gradually decrease in a direction from the first side 105s1 of the semiconductor substrate 105 toward the second side 105s2 of the semiconductor substrate 105.

In an example embodiment, when viewed based on the cross-sectional structure of FIG. 2B, each of the first lateral surface 146s1 and the second lateral surface 146s2 of the upper separation structure 146 may have a negative angle of inclination. For example, a width of the upper separation structure 146 may gradually decrease in a direction from the second side 105s2 of the semiconductor substrate 105 toward the first side 105s1 of the semiconductor substrate 105.

In an example embodiment, each of the first lateral surface 146s1 and the second lateral surface 146s2 of the upper separation structure 146 may have a first angle of inclination, and each of the first lateral surface 136s1 and the second lateral surface 136s2 of the lower separation structure 136 may have a second angle of inclination, steeper than the first angle of inclination.

In an example embodiment, the upper end 136U of the lower separation structure 136 and the lower end 146L of the upper separation structure 146 may be located on different height levels. The upper end 136U of the lower separation structure 136 may be located on a higher level than the lower end 146L of the upper separation structure 146.

In an example embodiment, a lower end of the lower extension portion 146E of the upper separation structure 146 may be the lower end 146L of the upper separation structure 146.

In an example embodiment, a height difference between the lower end 146L of the lower extension portion 146E of the upper separation structure 146 and the upper end 136U of the lower separation structure 136 may be greater than the first width W1a of the lower separation structure 136 adjacent to the first side 105s1 of the semiconductor substrate 105.

In an example embodiment, a height difference between the lower end 146L of the lower extension portion 146E of the upper separation structure 146 and the upper end 136U of the lower separation structure 136 may be greater than the third width W2a of the upper separation structure 146 adjacent to the second side 105s2 of the semiconductor substrate 105.

In an example embodiment, the lower end 146L of the lower extension portion 146E of the upper separation structure 146 may be located on a higher level than a horizontal central axis Ch passing through a center between the first side 105s1 of the semiconductor substrate 105 and the second sides 105s2 of the semiconductor substrate 105. The upper end 136U of the lower separation structure 136 may be located on a higher level than the horizontal central axis Ch. For example, a length between a lower end of the lower separation structure 136 and an upper end 136U of the lower separation structure 136 may be greater than a length between the lower end 146L of the upper separation structure 146 and an upper end of the upper separation structure 146. The upper end of the upper separation structure 146 may be coplanar with the second side 105s2 of the semiconductor substrate 105. A height difference between the lower end 146L of the upper separation structure 146 and the upper end 136U of the lower separation structure 136 may be greater than a width of the lower separation structure 136.

In an example embodiment, a distance between the lower end 146L of the lower extension portion 146E of the upper separation structure 146 and the second side 105s2 of the semiconductor substrate 105 may be greater than a distance between the lower end 146L of the lower extension portion 146E of the upper separation structure 146 and the horizontal central axis Ch.

Next, with reference to FIG. 3, a description will be made about an interface between the lower separation structure 136 and the upper separation structure 146 between the plurality of pixel regions PX.

Figure 3:
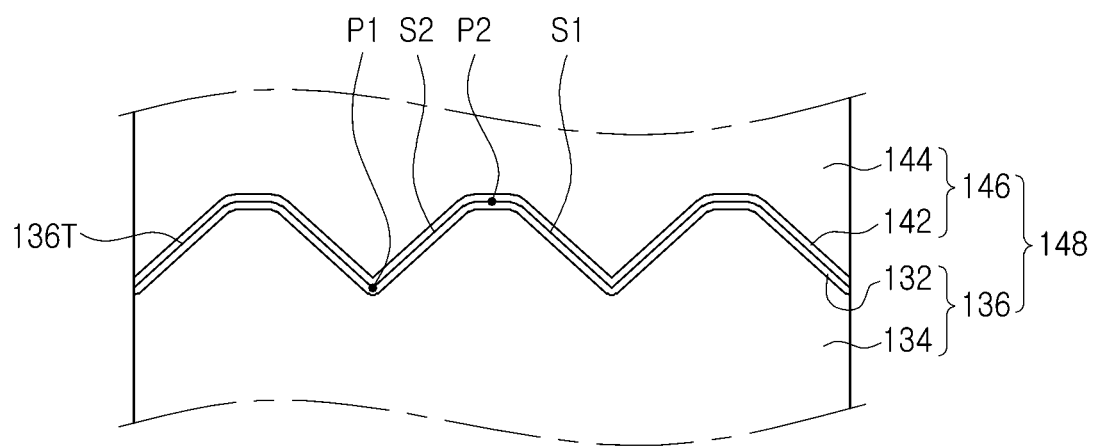
FIG. 3 is a partially enlarged cross-sectional view illustrating an enlarged portion of a portion of the components of FIG. 1.

Referring to FIG. 3 along with FIGS. 1, 2A and 2B, the first photoelectric regions 150a may be disposed in the plurality of pixel regions PX. Therefore, the first photoelectric regions 150a may be arranged in a first direction D1 and a second direction D2, perpendicular to each other. In this case, the first direction D1 and the second direction D2 may be parallel to the first side 105s1 of the semiconductor substrate 105.

The first separation structure 148 may include a linear portion located between the first photoelectric regions 150a and extending in the first direction D1. In this case, the linear portion of the first separation structure 148 extending in the first direction D1 can be understood as a portion indicated by II-IF of FIG. 1.

FIG. 3 illustrates a portion of a cross-sectional structure of the linear portion of the first separation structure 148 in the first direction D1. For example, in the cross-sectional structure of the linear portion of the first separation structure 148 in the first direction D1, FIG. 3 illustrates an interface 136T between the upper surface of the lower separation structure 136 and the lower surface of the upper separation structure 146 as a central portion. The interface 136T may be referred to as the upper surface of the lower separation structure 136 or the lower surface of the upper separation structure 146.

In the cross-sectional structure of the linear portion of the first separation structure 148 in the first direction D1, the upper surface 136T of the lower separation structure 136 may include a plurality of first portions P1 having a concave shape. At least one of the plurality of first portions P1 may be formed at a position where a first inclined surface S1 and a second inclined surface S2, having different angles of inclination, meet each other.

In the cross-sectional structure of the linear portion of the first separation structure 148 in the first direction D1, at least one of the upper surface of the lower separation structure 136 and the lower surface of the upper separation structure 146 may include a plurality of first portions P1 that may be bent or protrude in a direction facing the first side 105s1 of the semiconductor substrate 105.

In the cross-sectional structure of the linear portion of the first separation structure 148 in the first direction D1, at least one of the upper surface of the lower separation structure 136 and the lower surface of the upper separation structure 146 may include the first inclined surface S1 and the second inclined surface S2 that may be repeatedly arranged in the first direction D1 and have different angles of inclination.

In the cross-sectional structure of the linear portion in the first direction D1, the upper surface 136T of the lower separation structure 136 may include a second portion P2 having a convex shape between a pair of first portions P1 adjacent to each other, among the plurality of first portions P1, and the plurality of first portions P1 may be between the first photoelectric regions 150a adjacent to each other in the second direction D2. At least one of the upper surface of the lower separation structure 136 and the lower surface of the upper separation structure 146 may have a wavy shape.

Next, various modified examples of the first separation structure 148 will be described with reference to FIGS. 4 to 11C. Hereinafter, each of FIGS. 4 to 11C illustrates partially enlarged cross-sectional views corresponding to the partially enlarged cross-sectional views of FIG. 2B, and illustrates various modified examples of the first separation structure 148 of FIG. 2B. In the following, among components of a first separation structure in the modified examples of FIGS. 4 to 11C, a component without a separate description or a component with only a brief description can be understood from the descriptions of the components of the first separation structure 148 of FIG. 2B. Therefore, in the following, in describing a modified example of the first separation structure with reference to each of FIGS. 4 to 11C, a description of the first separation structure that may be easily understood from FIG. 2B may be omitted, and a description will focus on a deformed portion or a replaced portion of the first separation structure. In addition, hereinafter, in describing the modified examples of the first separation structure with reference to each of FIGS. 4 to 11C, a description of the cross-sectional structure of the linear portion of the first separation structure 148 in the first direction D1, as in FIG. 3, will be omitted. For example, the first separation structure of various modifications described with reference to FIGS. 4 to 11C may have the same or similar cross-sectional structure as in FIG. 3.

Figure 4:
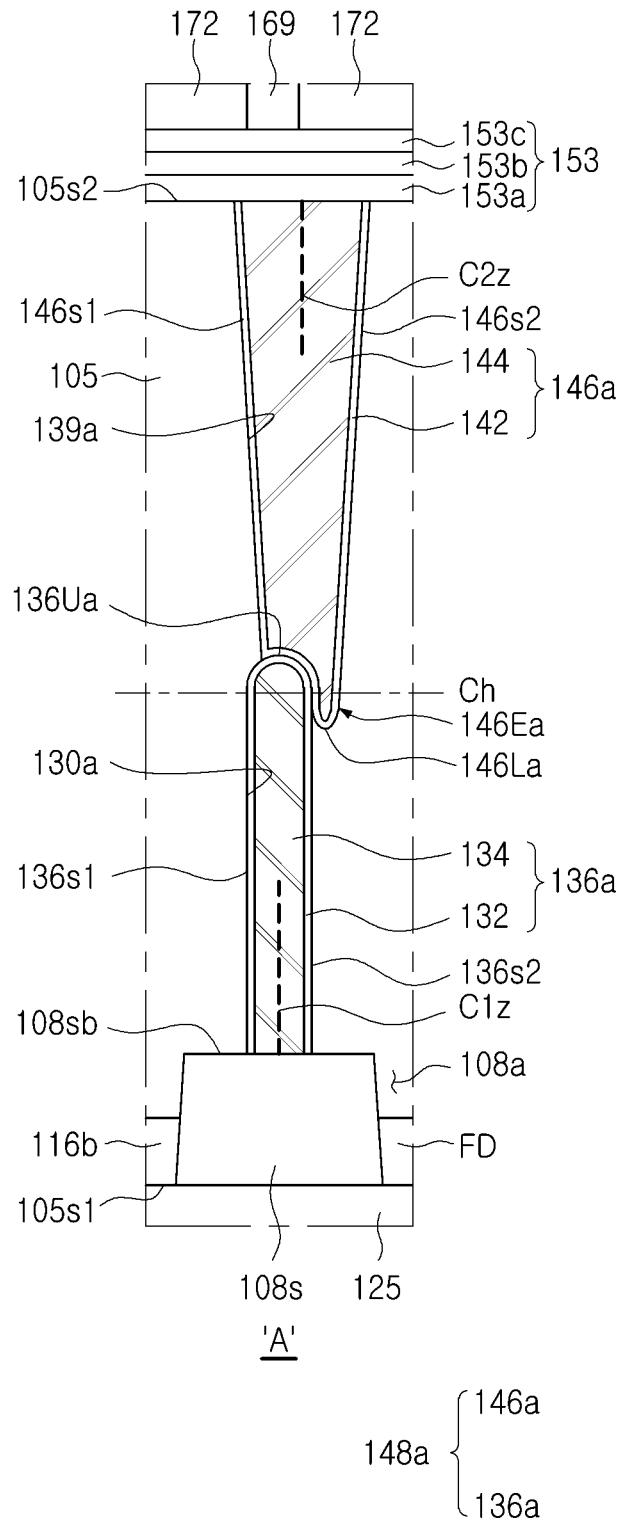
FIGS. 4 to 11C are partially enlarged cross-sectional views each illustrating modified examples of an image sensor according to an embodiment.

In a modified example, referring to FIG. 4, a first separation structure 148a in the modified example may include a lower separation structure 136a in a lower separation trench 130a and an upper separation structure 146a in an upper separation trench 139a. The lower separation structure 136a may have an upper end 136Ua having a lower level, as compared to the upper end 136U of the lower separation structure 136 described in FIG. 2B, and the upper separation structure 146a may have a lower end 146La of a lower extension portion 146Ea having a lower level, as compared to the lower end 146L of the lower extension portion 146E of the upper separation structure 146 described in FIG. 2B. For example, the upper end 136Ua of the lower separation structure 136a may be located on a level higher than a horizontal central axis Ch, and the lower end 146La of the lower extension portion 146Ea of the upper separation structure 146a may be located on a level lower than the horizontal central axis Ch.

Figure 5:
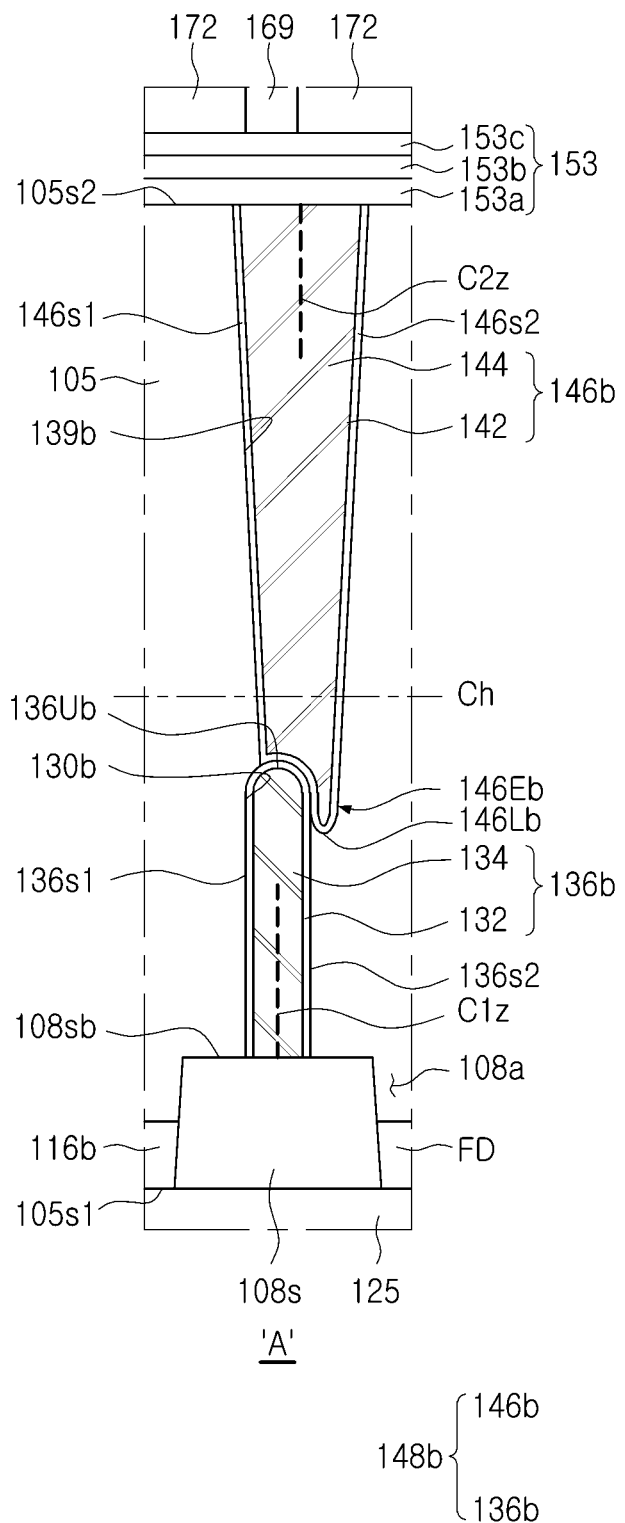

In a modified example, referring to FIG. 5, a first separation structure 148b in the modified example may include a lower separation structure 136b in a lower separation trench 130b and an upper separation structure 146b in an upper separation trench 139b. The lower separation structure 136b may have an upper end 136Ub having a lower level, as compared to the upper end 136U of the lower separation structure 136 described in FIG. 2B, and the upper separation structure 146b may have a lower end 146Lb of a lower extension portion 146Eb having a lower level, as compared to the lower end 146L of the lower extension portion 146E of the upper separation structure 146 described in FIG. 2B. For example, the upper end 136Ub of the lower separation structure 136b may be located on a level lower than a horizontal central axis Ch, and the lower end 146Lb of the lower extension portion 146Eb of the upper separation structure 146b may be located on a level lower than the upper end 136Ub of the lower separation structure 136b and the horizontal central axis Ch.

Figure 6A:
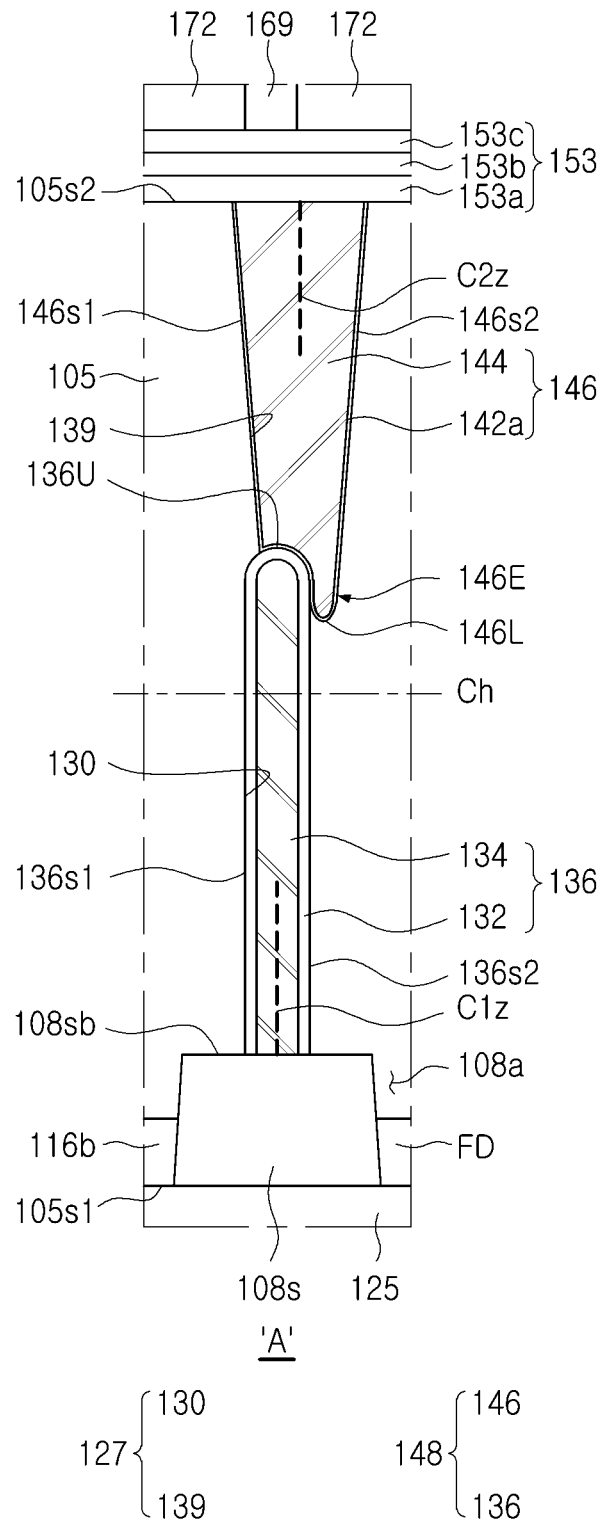

In a modified example, referring to FIG. 6A, in the first separation structure 148 of FIG. 2B, the upper material layer (142 of FIG. 2B) of the upper separation structure 146 may be replaced with an upper material layer 142a having a reduced thickness. Therefore, a thickness of an upper material layer 142a of an upper separation structure 146 may be less than a thickness of a lower material layer 132 of a lower separation structure 136.

Figure 6B:
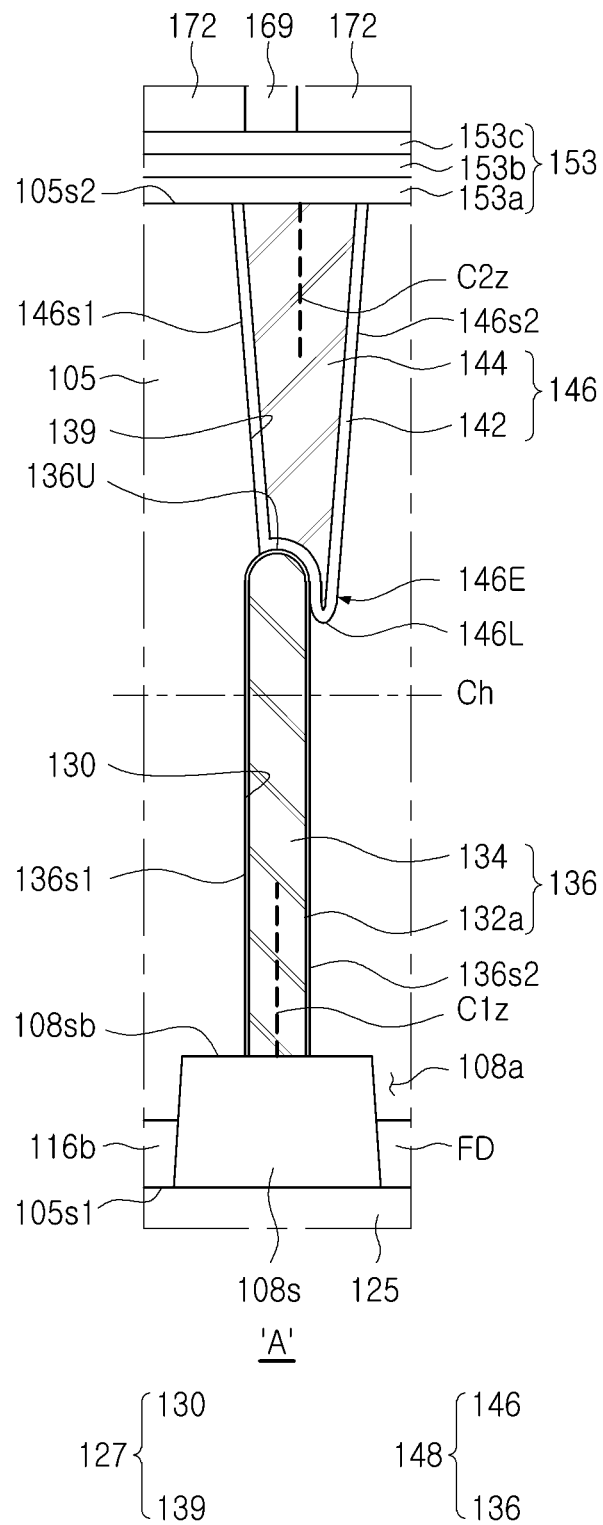

In a modified example, referring to FIG. 6B, in the first separation structure 148 of FIG. 2B, the lower material layer (132 of FIG. 2B) of the lower separation structure 136 may be replaced with a lower material layer 132a having a reduced thickness. Therefore, a thickness of a lower material layer 132a of a lower separation structure 136 may be less than a thickness of an upper material layer 142 of an upper separation structure 146.

Figure 6C:
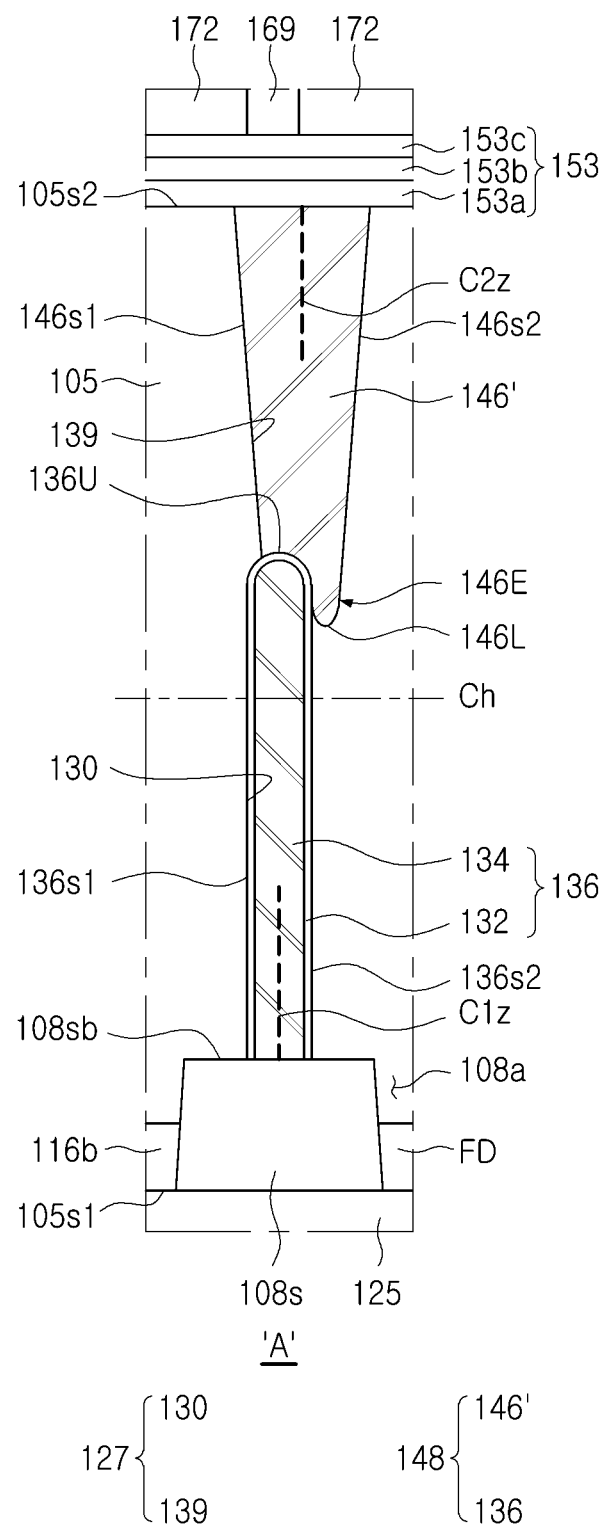

In a modified example, referring to FIG. 6C, in the first separation structure 148 of FIG. 2B, the upper separation structure (146 of FIG. 2B) including different types of material layers may be replaced with an upper separation structure 146' having a single type of material layer. For example, the upper separation structure 146' may be a silicon oxide filling an upper separation trench 139.

Figure 6D:
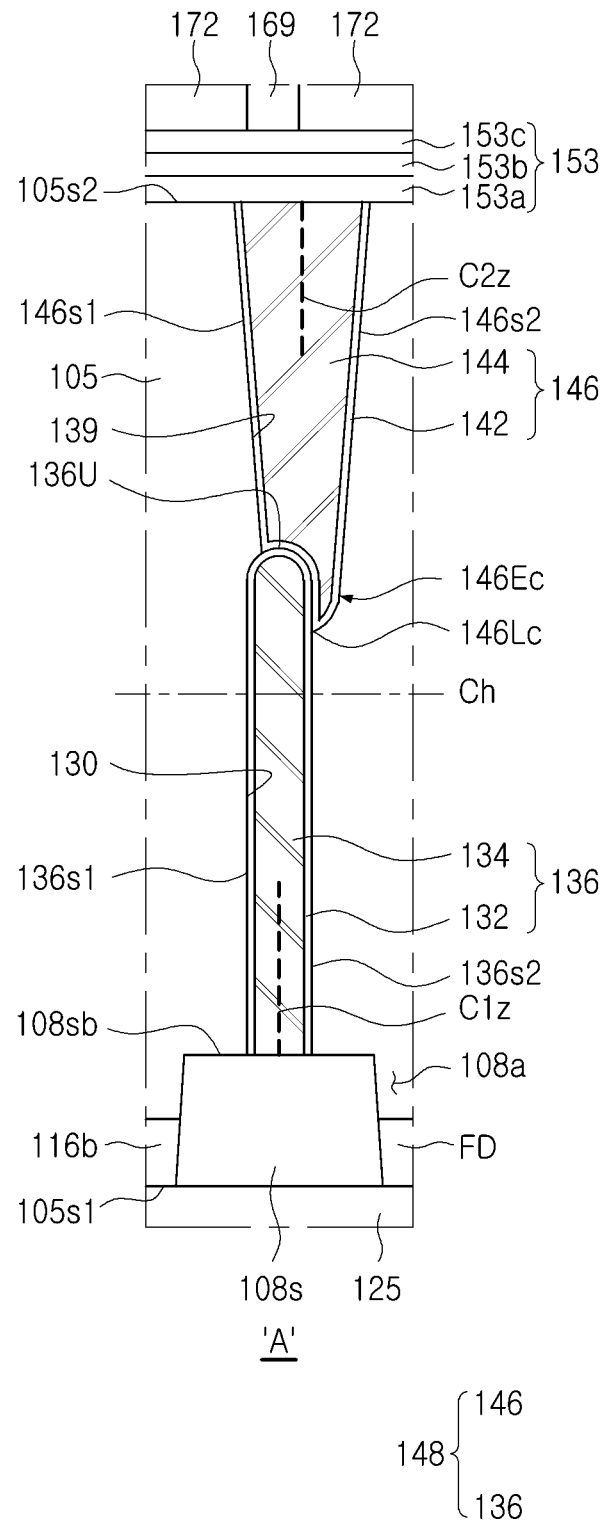

In a modified example, referring to FIG. 6D, in the first separation structure 148 of FIG. 2B, the lower extension portion (146E of FIG. 2B) of the upper separation structure 146 may be replaced with a lower extension portion 146Ec contacting a lower separation structure 136. A lower end 146Lc of the lower extension portion 146Ec may be a portion contacting a lower separation structure 136.

Figure 7A:
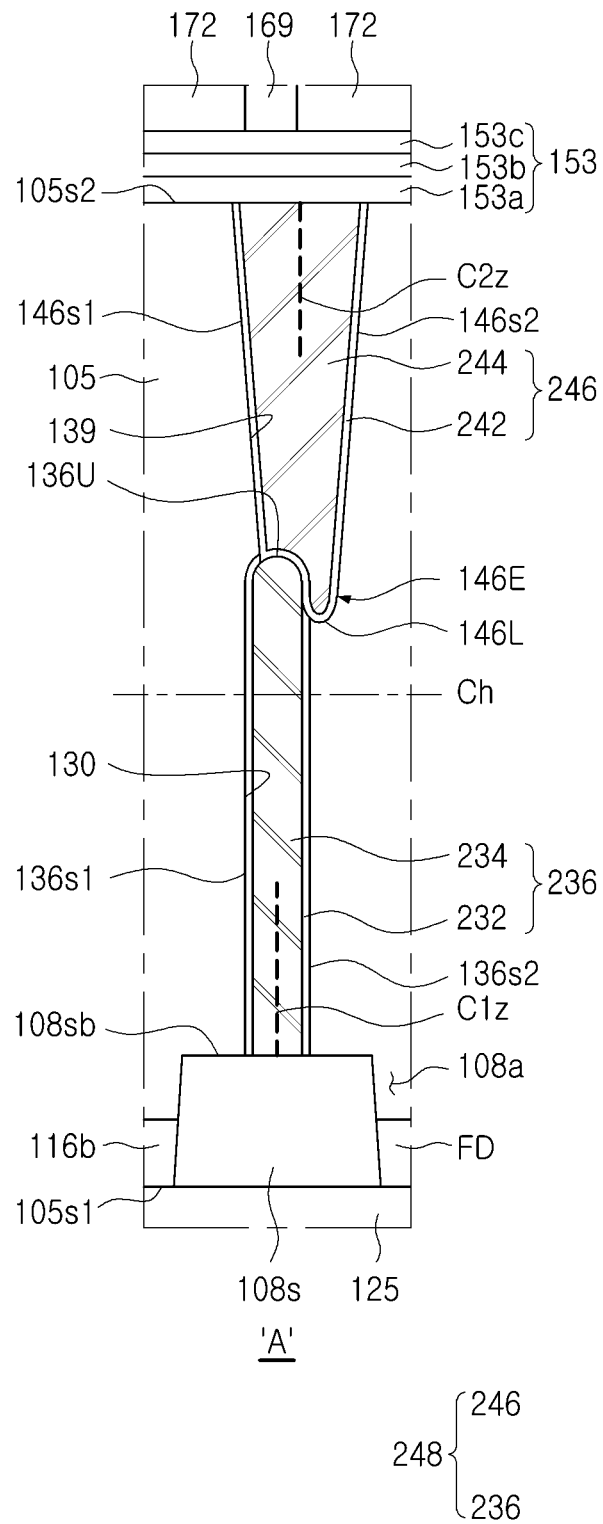

In a modified example, referring to FIG. 7A, a first separation structure 248 in the modified example may include a lower separation structure 236 and an upper separation structure 246 on the lower separation structure 236.

The lower separation structure 236 may include a lower material pattern 234, substantially identical to the lower material pattern (134 of FIG. 2B) described in FIG. 2B, and a lower material layer 232 interposed between the lower material pattern 234 and the semiconductor substrate 105. The upper separation structure 246 may include an upper material pattern 244, substantially identical to the upper material pattern (144 of FIG. 2B) described in FIG. 2B, and an upper material layer 242 interposed between the upper material pattern 244 and the semiconductor substrate 105 and interposed between the upper material pattern 244 and a lower separation structure 236. The upper material layer 242 may be in contact with the upper material pattern 244 and the lower material pattern 234.

Figure 7B:
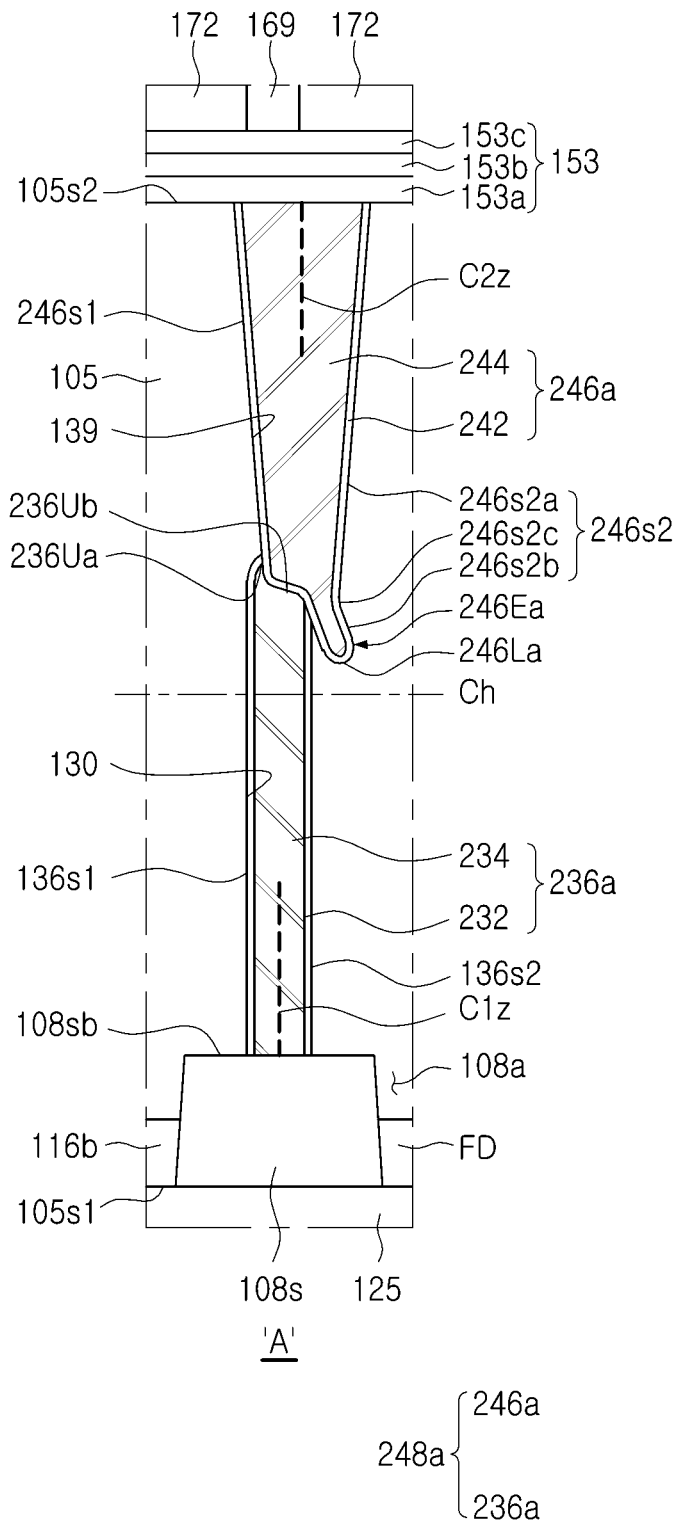

In a modified example, referring to FIG. 7B, a first separation structure 248a in the modified example may include a lower separation structure 236a and an upper separation structure 246a on the lower separation structure 236a.

The lower separation structure 236a may include a lower material pattern 234 and a lower material layer 232 between the lower material pattern 234 and the semiconductor substrate 105. The upper separation structure 246a may include an upper material pattern 244, and an upper material layer 242 interposed between the upper material pattern 244 and the semiconductor substrate 105, and interposed between the upper material pattern 244 and the lower material pattern 234.

The upper separation structure 246a may have a first lateral surface 246s1 and a second lateral surface 246s2, opposite to each other. In the upper separation structure 246a, at least a portion of the first lateral surface 246s1 may overlap the lower separation structure 236a, and the second lateral surface 246s2 may not overlap the lower separation structure 236a.

In the upper separation structure 246a, the second lateral surface 246s2 may include a first portion 246s2a having a first angle of inclination, a second portion 246s2b having a second angle of inclination, and a third portion 246s2c between the first portion 246s2a and the second portions 246s2b.

The upper separation structure 246a may further include a lower extension portion 246Ea extending in a downward direction without overlapping the lower separation structure 236a in a vertical direction. The lower extension portion 246Ea may include a portion spaced apart from a second lateral surface 136s2 of the lower separation structure 236a overlapping the upper separation structure 246a. The spaced apart portion may include the lower end 246La of the upper separation structure 246a.

In the second lateral surface 246s2 of the upper separation structure 246a, the first portion 246s2a may have a negative angle of inclination, the second portion 246s2b may have a positive angle of inclination, and the third portion 246s2c may be a portion changing from the positive angle of inclination to the negative angle of inclination, and may be bent to have a curved shape. The third portion 246s2c may be referred to as a bent portion. On the second lateral surface 246s2 of the upper separation structure 246a, the third portion 246s2c may have a shape recessed in a direction of a vertical central axis C2z of the upper separation structure 246a.

On the second lateral surface 246s2 of the upper separation structure 246a, the second portion 246s2b may be at least a portion of an outer surface of the lower extension portion 246Ea.

On the second lateral surface 246s2 of the upper separation structure 246a, the second portion 246s2b may overlap the lower separation structure 236a in a horizontal direction.

On the second lateral surface 246s2 of the upper separation structure 246a, the second portion 246s2b may be located on a level lower than an upper end 236Ua of the lower separation structure 236a.

On the second lateral surface 246s2 of the upper separation structure 246a, the third portion 246s2c may be located on a level lower than the upper end 236Ua of the lower separation structure 236a.

The lower separation structure 236a may have an upper surface 236Ub recessed from the upper end 236Ua. In this case, the recessed upper surface 236Ub of the lower separation structure 236a may be in contact with the upper separation structure 246a, and a surface of the upper end 236Ua of the lower separation structure 236a in a vertical direction may not be in contact with the upper separation structure 246a. A height difference between the lower end 246La of the upper separation structure 246a and an upper end 236Ua of the lower separation structure 236a may be greater than a width of the lower separation structure 236a.

The recessed upper surface 236Ub of the lower separation structure 236a contacting the upper separation structure 246a may be located on a level higher than a lower end 246La of the lower extension portion 246Ea of the upper separation structure 246a. In this case, the lower extension portion 246Ea may be referred to as an outer lower extension portion.

Figure 7C:
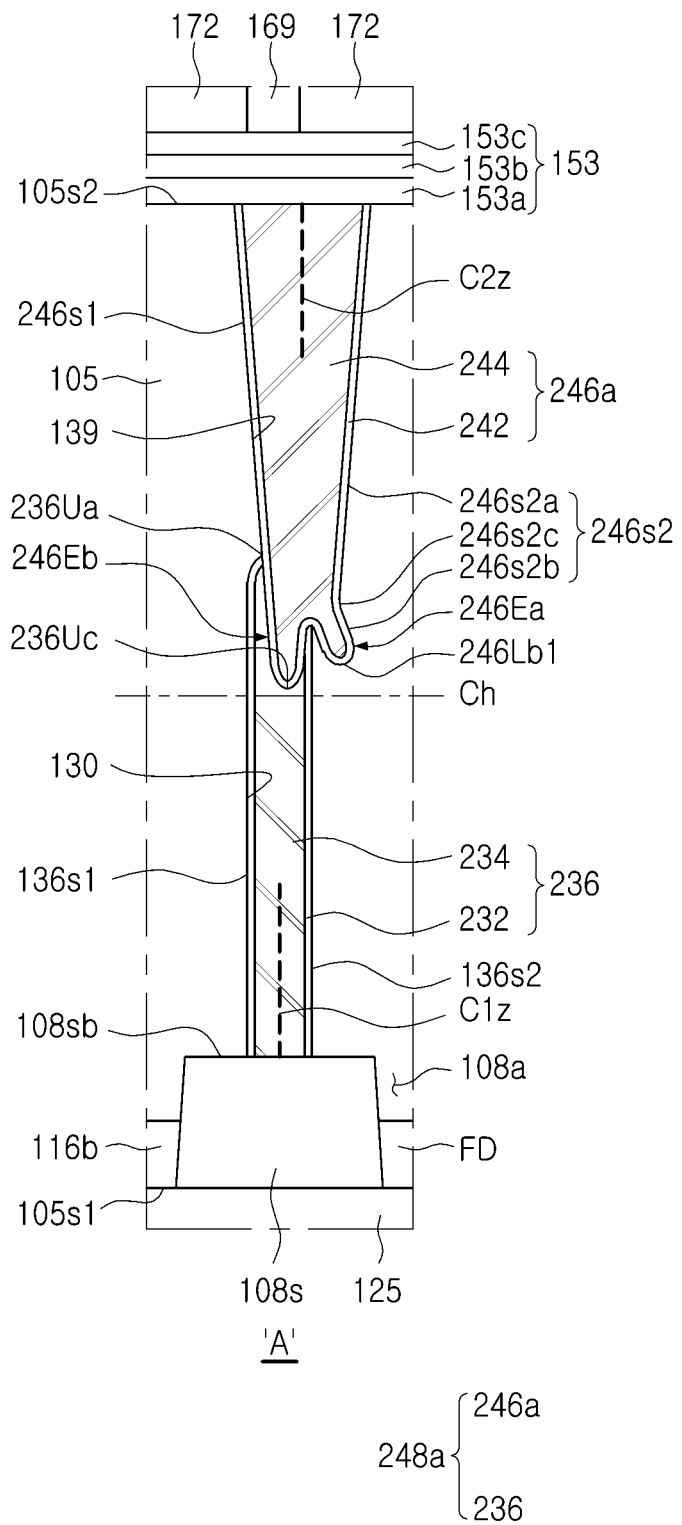

In a modified example, referring to FIG. 7C, in the first separation structure 248a of FIG. 7B, the recessed upper surface (236Ub of FIG. 7B) of the lower separation structure 236a may be replaced with a recessed upper surface 236Uc located on a level lower than the lower end 246La of the lower extension portion 246Ea.

In the modified example, referring to FIG. 7C, in the first separation structure 248a of FIG. 7B, the upper separation structure 246a may further include a medial lower extension portion 246Eb contacting the recessed upper surface 236Uc. A lower end of the medial lower extension portion 246Eb may be located on a level lower than a lower end 246Lb1 of the lower extension portion 246Ea. The lower end of the medial lower extension portion 246Eb may be referred to as 236Uc in FIG. 7C.

Figure 8A:
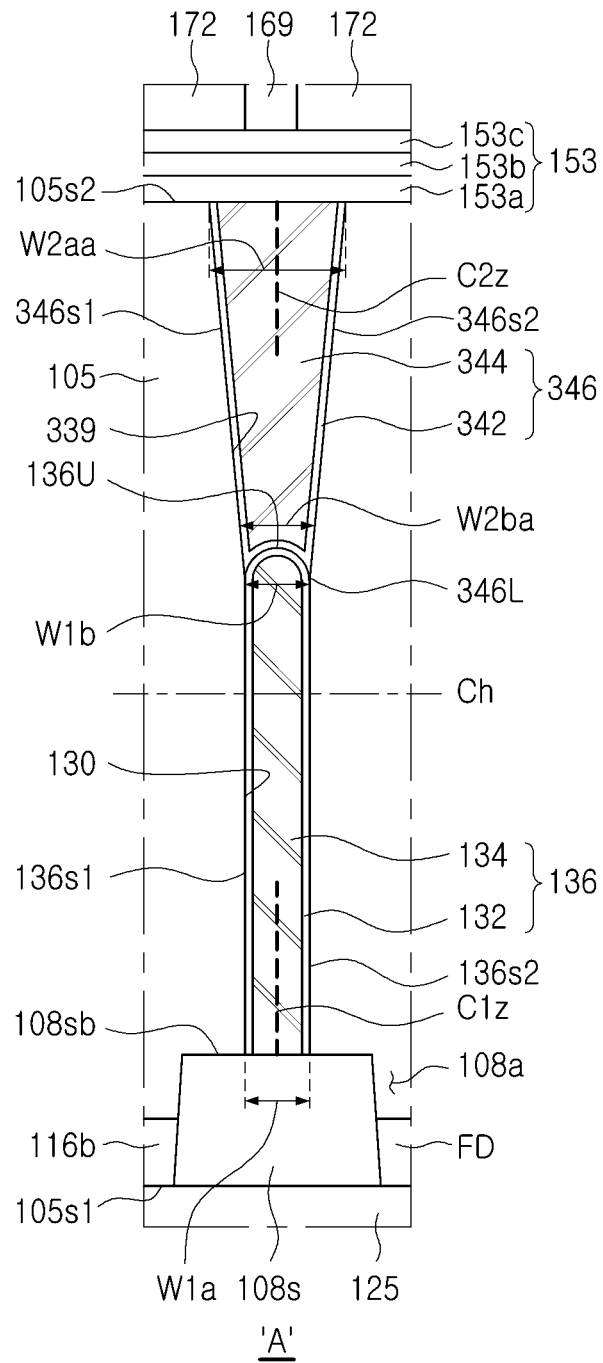

In a modified example, referring to FIG. 8A, in the first separation structure 148 of FIG. 2B, the upper separation structure 146 may be replaced with an upper separation structure 346 as in FIG. 8A. For example, the upper separation structure 346 may be disposed in an upper separation trench 339.

The upper separation structure 346 may have a first lateral surface 346s1 and a second lateral surface 346s2 opposite to each other. The first lateral surface 346s1 and the second lateral surface 346s2 may have a negative angle of inclination. In the upper separation structure 346, a third width W2aa of the upper separation structure 346 adjacent to a second side 105s2 of a semiconductor substrate 105 may be greater than a fourth width W2ba of the upper separation structure 346 adjacent to a lower separation structure 136. The third width W2aa may be respectively greater than a first width W1a and a second width W1b.

A second vertical central axis C2z of the upper separation structure 346 passing through a center between the first lateral surface 346s1 and the second lateral surface 346s2 may be substantially vertically aligned with a first vertical central axis C1z of the lower separation structure 136.

The upper separation structure 346 may include an upper material layer 342 and an upper material pattern 344, respectively corresponding to the upper material layer 142 and the upper material pattern 144 described in FIG. 2B.

An upper surface 136U of the lower separation structure 136 may have a convex shape in an upward direction, and a lower surface of the upper separation structure 346 may be in entire contact with the upper surface 136U of the lower separation structure 136.

Figure 8B:
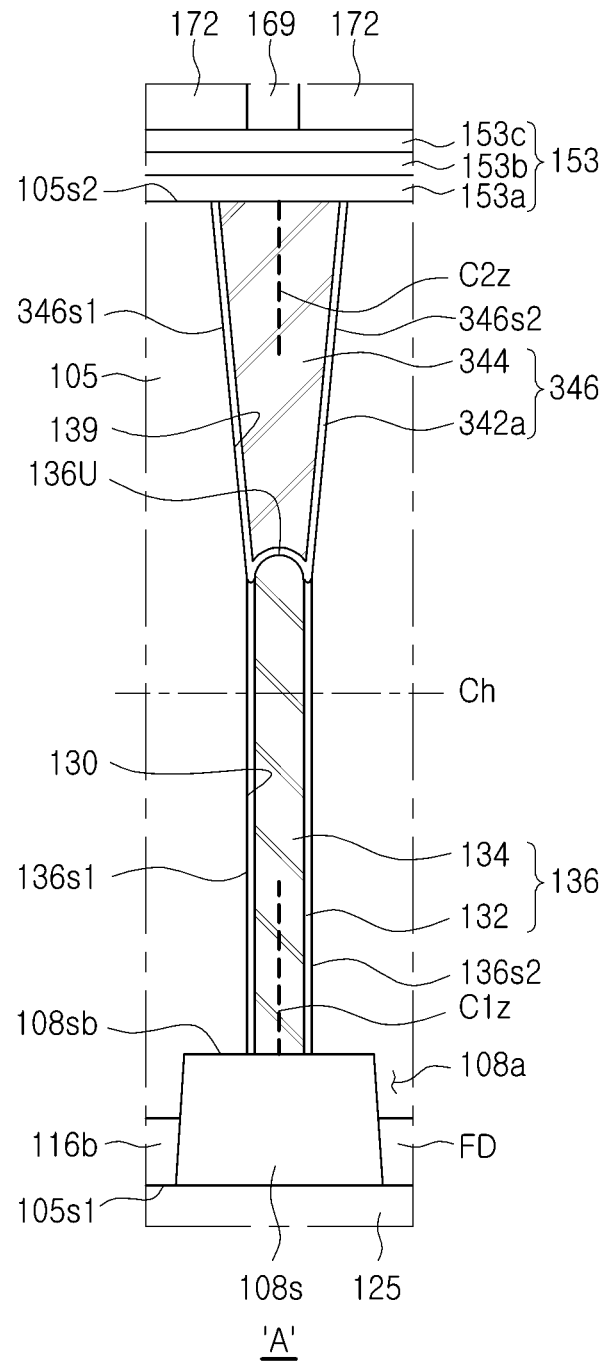

In a modified example, referring to FIG. 8B, the upper material layer (342 of FIG. 8A) of the upper separation structure 346 described in FIG. 8A may be replaced with an upper material layer 342a passing through a lower material layer 132 of a lower separation structure 136 and contacting a lower material pattern 134.

Figure 8C:
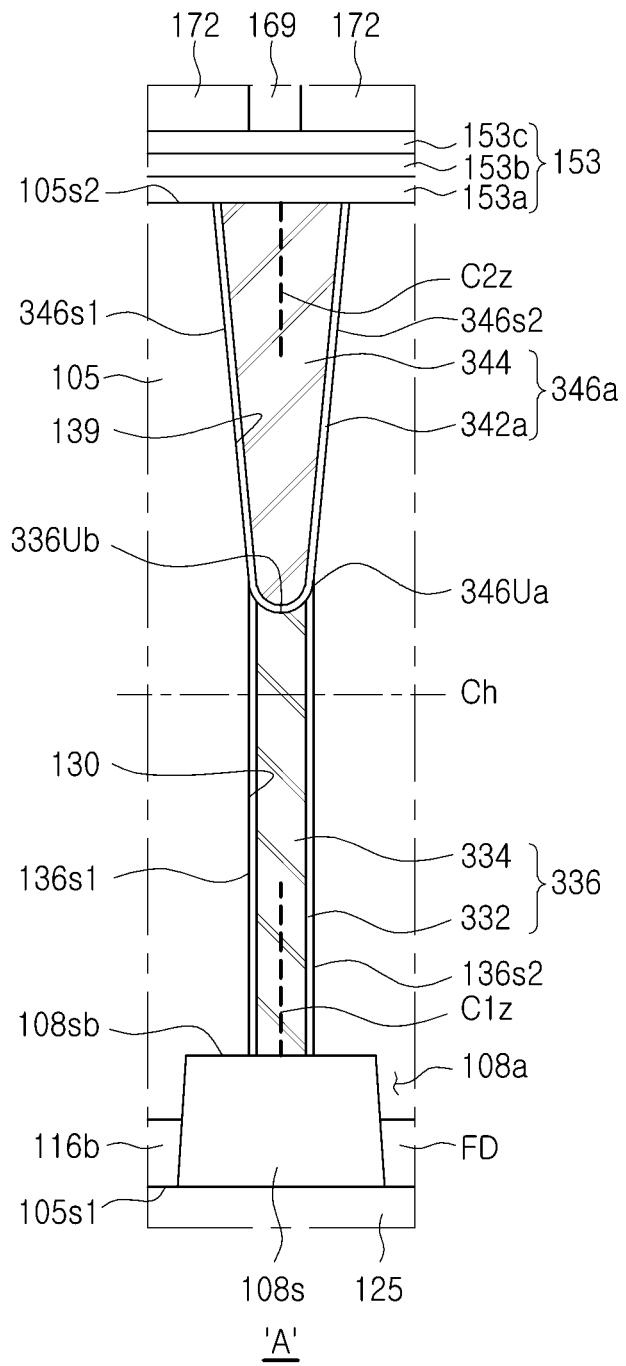

In a modified example, referring to FIG. 8C, the lower separation structure 136 in FIG. 8B may be replaced with a lower separation structure 336 having upper ends 336Ua protruding respectively from regions adjacent to both lateral surfaces 346s1 and 346s2, and an upper surface 336Ub recessed between the upper ends 336Ua. The upper separation structure 346 in FIG. 8B may be replaced with the upper separation structure 346a contacting the upper surface 336Ub recessed between the upper ends 336Ua of the lower separation structure 336 and having a convex shape in a downward direction. In this case, the convex shape may be a curved shape, but the inventive concept is not limited thereto. For example, the upper separation structure 346a may have a pointed shape in a downward direction.

Figure 9A:
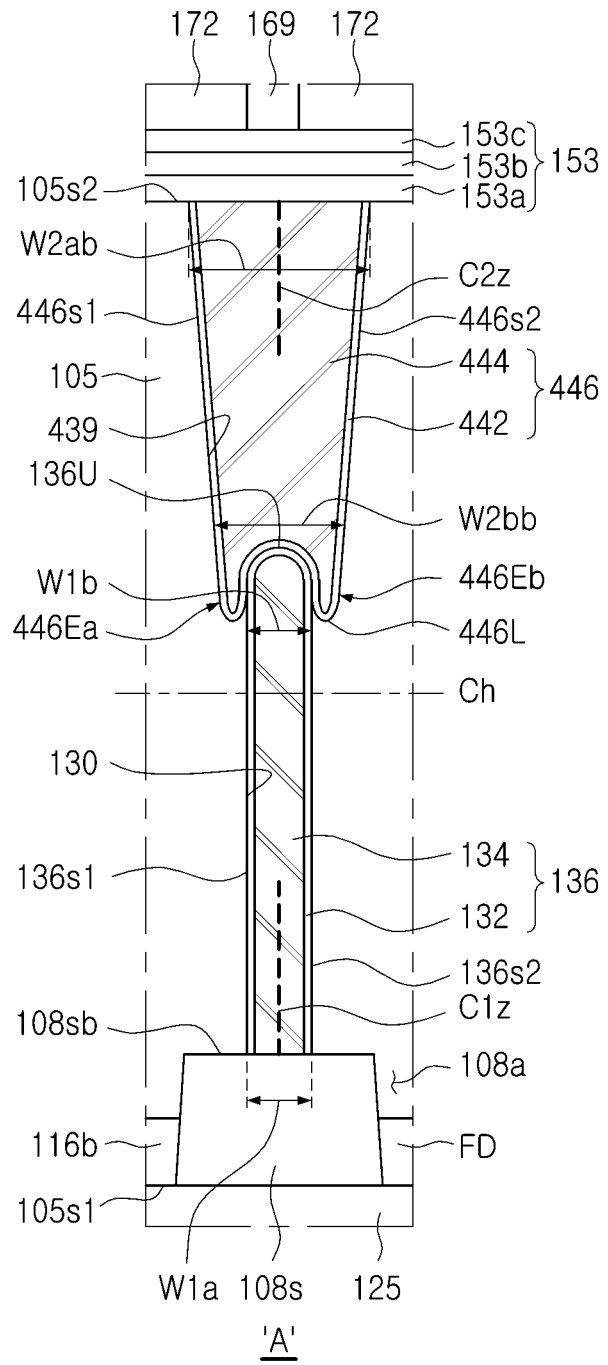

In a modified example, referring to FIG. 9A, in the first separation structure 148 of FIG. 2B, the upper separation structure 146 may be replaced with an upper separation structure 446 having a greater width. For example, the upper separation structure 446 may be disposed in an upper separation trench 439, and may have a first lateral surface 446s1 and a second lateral surface 446s2 opposite to each other. In the upper separation structure 446, the first lateral surface 446s1 and the second lateral surface 446s2 may not overlap a lower separation structure 136 in a vertical direction.

In the upper separation structure 446, a third width W2ab of the upper separation structure 446 adjacent to a second side 105s2 of a semiconductor substrate 105 may be greater than a fourth width W2bb of the upper separation structure 446. The fourth width W2bb may be respectively greater than a first width W1a and a second width W1b.

The upper separation structure 446 may include a first lower extension portion 446Ea and a second lower extension portion 446Eb, extending in a direction facing a first side 105s1 of the semiconductor substrate 105 without overlapping the lower separation structure 136 in a vertical direction.

A portion of the lower separation structure 136 may be interposed between the first lower extension portion 446Ea and the second lower extension portion 446Eb.

At least one of the first lower extension portion 446Ea and the second lower extension portion 446Eb may include a portion spaced apart from lateral surfaces of the lower separation structure 136. The spaced apart portion may include lower ends 446L of the first lower extension portion 446Ea.

The lower ends 446L of the first lower extension portion 446Ea and the second lower extension portion 446Eb may be located on a lower level than an upper end 136U of the lower separation structure 136. A height difference between the lower ends 446L of the upper separation structure 446 and the upper end 136U of the lower separation structure 136 may be greater than a width of the lower separation structure 136.

The upper separation structure 446 may include an upper material layer 442 and an upper material pattern 444, respectively corresponding to the upper material layer 142 and the upper material pattern 144 described in FIG. 2B.

Figure 9B:
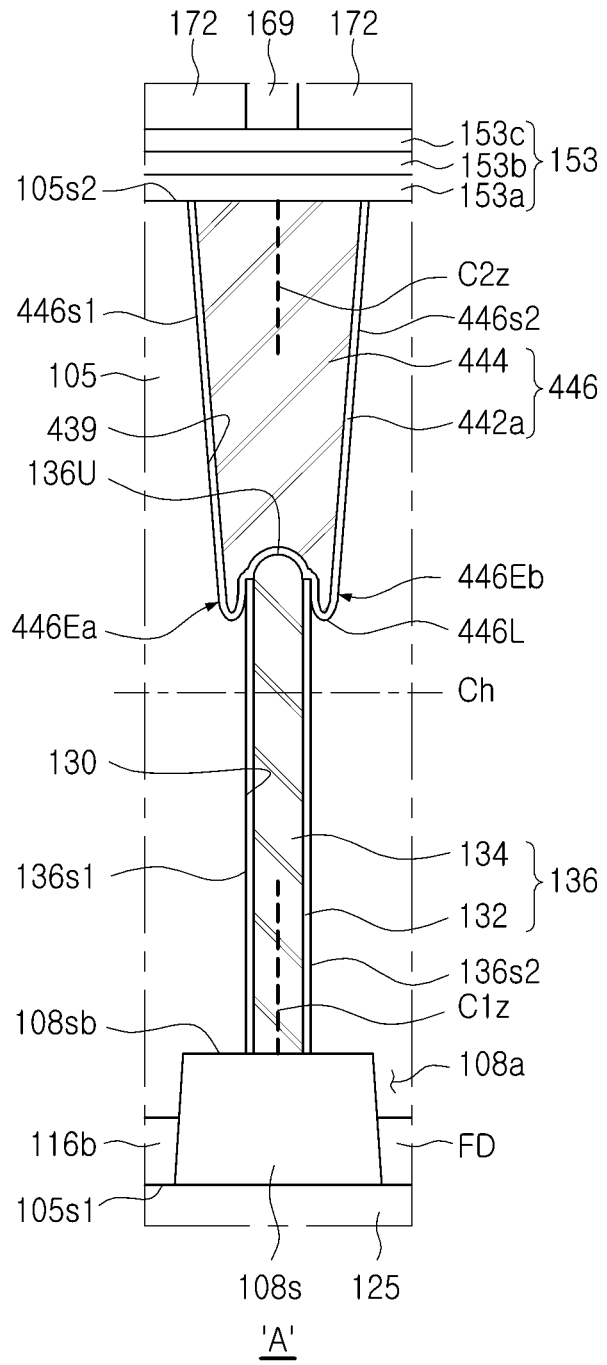

In a modified example, referring to FIG. 9B, the upper material layer (442 of FIG. 9A) of the upper separation structure 446 described in FIG. 9A may be replaced with an upper material layer 442a passing through or extended through a lower material layer 132 of a lower separation structure 136 and contacting a lower material pattern 134.

Figure 9C:
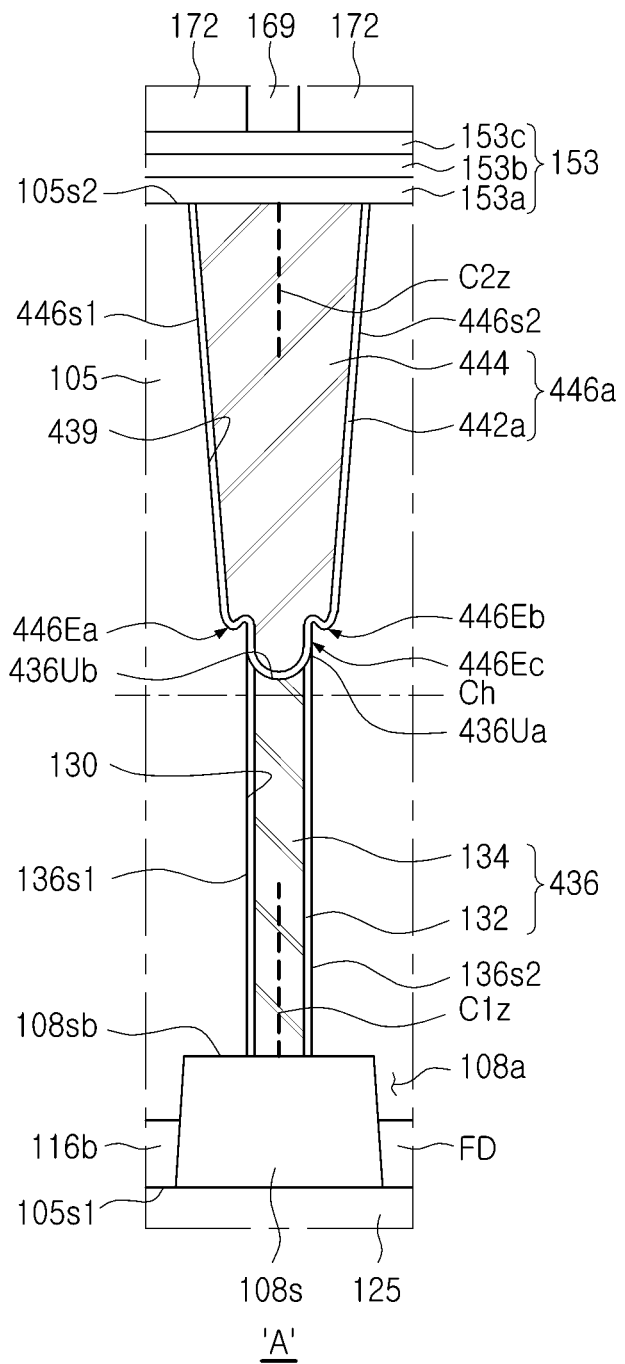

In a modified example, referring to FIG. 9C, the lower separation structure 136 in FIG. 9B may be replaced with a lower separation structure 436 having upper ends 436Ua protruding respectively from regions adjacent to both lateral surfaces 446s1 and 446s2, and an upper surface 436Ub recessed between the upper ends 436Ua. The upper separation structure 446 in FIG. 9B may be replaced with an upper separation structure 446a having a medial lower extension portion 446Ec contacting the upper surface 336Ub recessed between the upper ends 336Ua of the lower separation structure 436 and having a convex shape in a downward direction. In this case, the convex shape may be a curved shape, but the present inventive concept is not limited thereto. For example, the medial lower extension portion 446Ec of the upper separation structure 446a may have a pointed shape in a downward direction. Therefore, the upper separation structure 446a may have the medial lower extension portion 446Ec together with a first lower extension portion 446Ea and a second lower extension portion 446Eb. In this case, the first lower extension portion 446Ea and the second lower extension portion 446Eb may also be referred to as lateral lower extension portions.

In an example embodiment, a lower end of the medial lower extension portion 446Ec may be located on a lower level than lower ends of the first lower extension portion 446Ea and the second lower extension portion 446Eb.

Figure 9D:
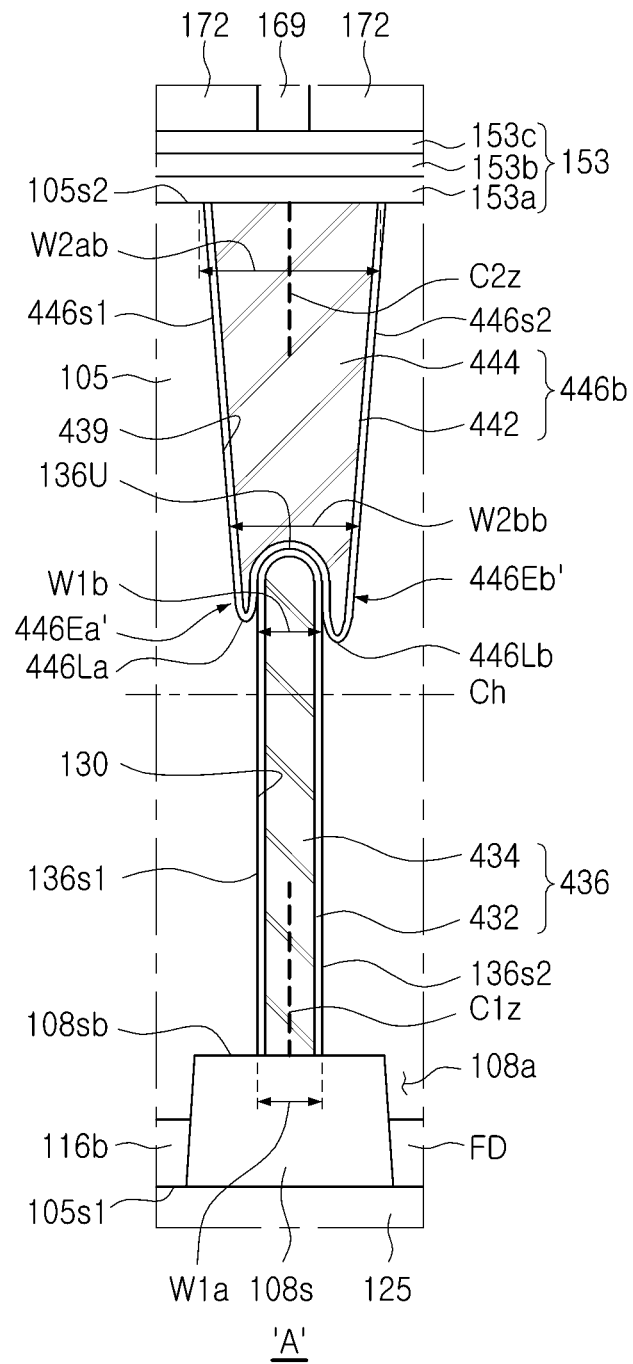

In a modified example, referring to FIG. 9D, the upper separation structure 446 in FIG. 9A may be replaced with an upper separation structure 446b having a second vertical central axis C2z that may not be vertically aligned with the first vertical central axis C1z of the lower separation structure 136. The first lower extension portion 446Ea and the second lower extension portion 446Eb in FIG. 9A may be respectively replaced with a first lower extension portion 446Ea' and a second lower extension portion 446Eb' having lower ends located on different height levels. A lower end 446La of the first lower extension portion 446Ea' may be located on a higher level than a lower end 446Lb of the second lower extension portion 446Eb'. A width of the second lower extension portion 446Eb' may be greater than a width of the first lower extension portion 446Ea'.

In embodiments, the upper separation structure of FIGS. 9B and 9C may be modified in a similar manner to the upper separation structure 446b.

Figure 10A:
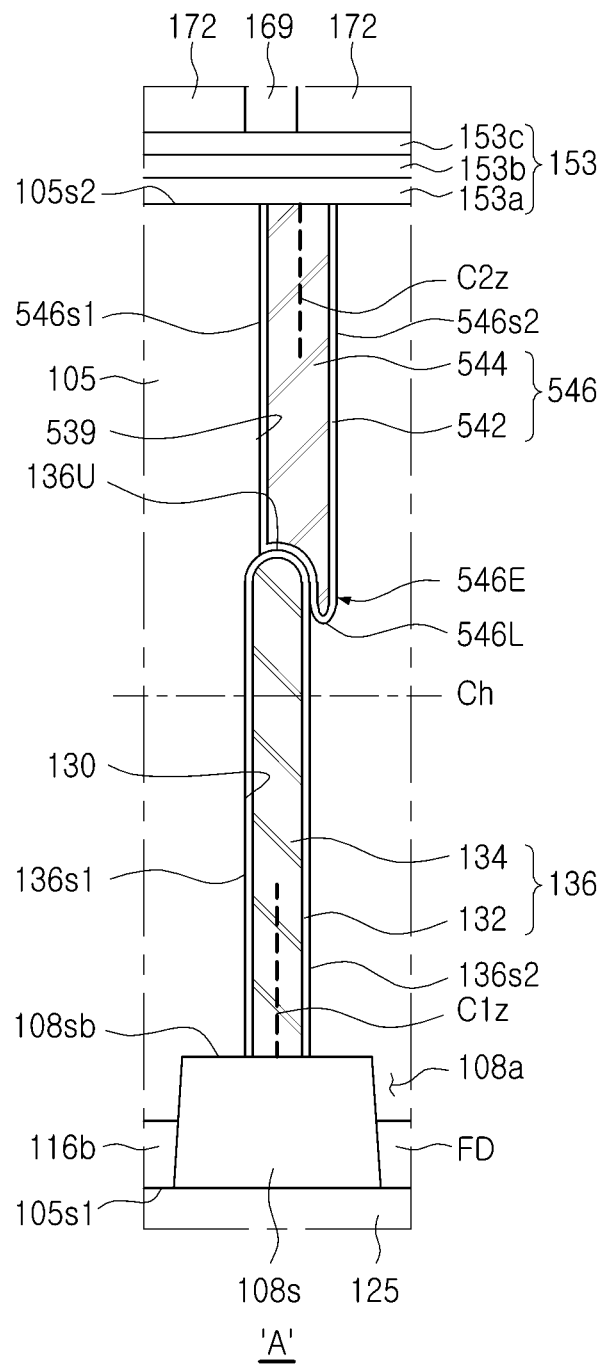

In a modified example, referring to FIG. 10A, in the first separation structure 148 of FIG. 2B, the upper separation structure 146 may be replaced with an upper separation structure 546 having substantially vertical lateral surfaces 546s1 and 546s2. The upper separation structure 546 may include an upper material layer 542 and an upper material pattern 544, respectively corresponding to the upper material layer 142 and the upper material pattern 144 described in FIG. 2B. The upper separation structure 546 may have substantially the same width as a lower separation structure 136. A vertical central axis of the upper separation structure 546 may not be aligned with a vertical central axis of the lower separation structure 136 in a vertical direction. The upper separation structure 546 may have a lower extension portion 546E, corresponding to the lower extension portion (146E of FIG. 2B) in FIG. 2B. A lower end 546L of the lower extension portion 546E may be located on a lower level than an upper end 136U of the lower separation structure 136.

Figure 10B:
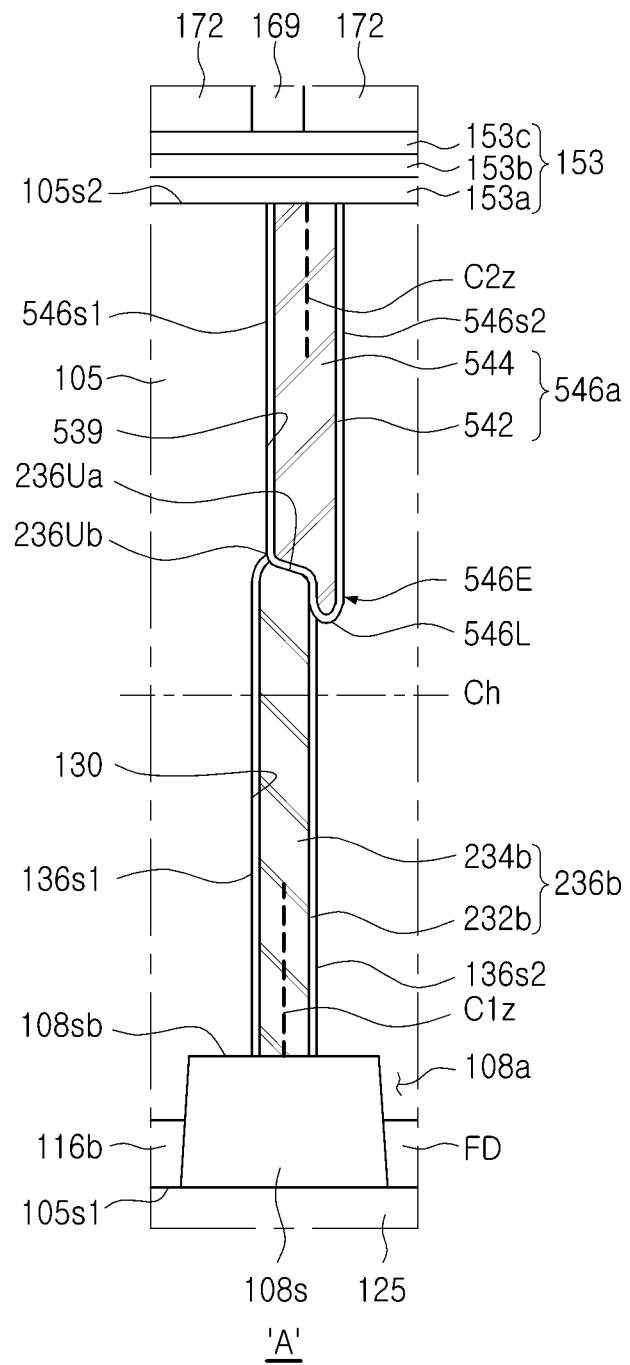

In a modified example, referring to FIG. 10B, the upper separation structure (246a of FIG. 7B) in the first separation structure 248a described in FIG. 7B may be replaced with an upper separation structure 546a having substantially the same width as a lower separation structure 236b as in FIG. 10B. The upper separation structure 546a may have a lower extension portion 546E substantially the same as that described in FIG. 10A. The lower extension portion 546E of the upper separation structure 546a may be transformed to the lower extension portion 246Ea in FIG. 7B.

Figure 10C:
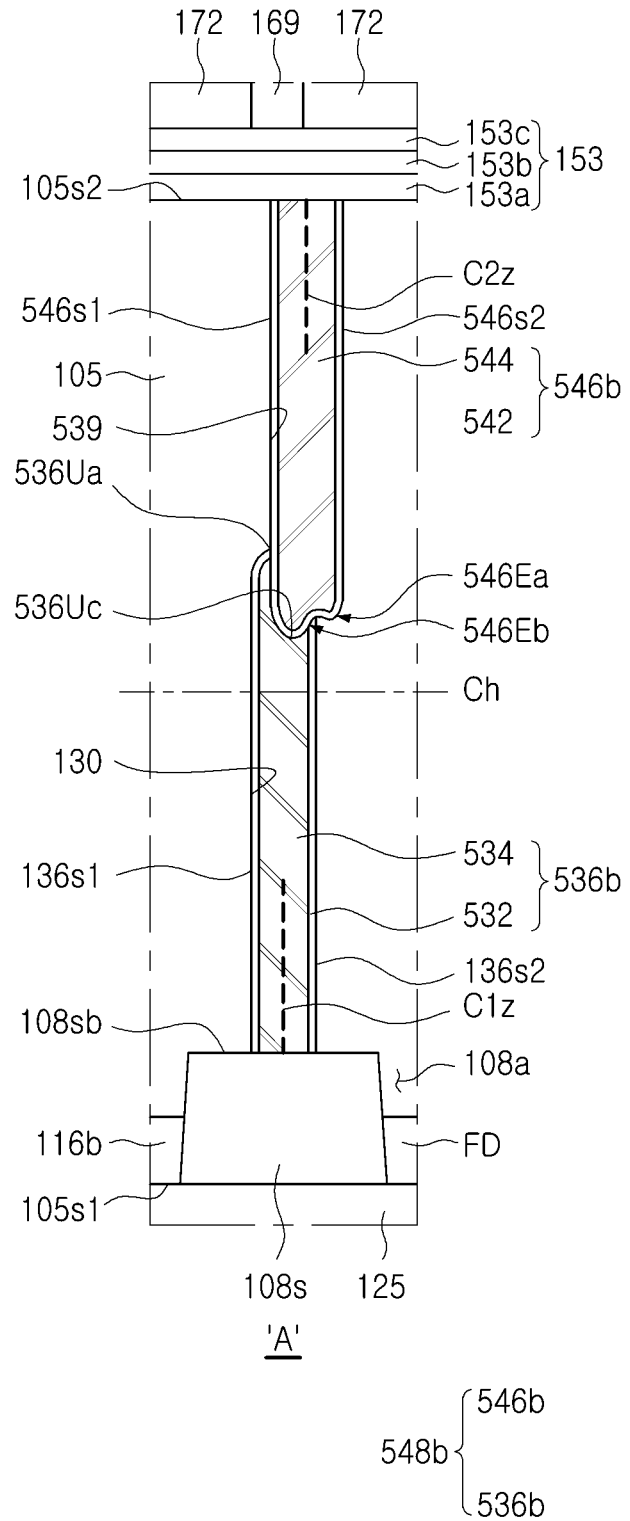

In a modified example, referring to FIG. 10C, a first separation structure 548b in the modified example may include a lower separation structure 536b and an upper separation structure 546b on the lower separation structure 536b. The upper separation structure 546b may be a modified example of the upper separation structure 546 in FIG. 10A.

The lower separation structure 536b may include a lower material pattern 534 having substantially the same material as the lower material pattern (134 of FIG. 2B) described in FIG. 2B, and a lower material layer 532 interposed between the lower material pattern 534 and a semiconductor substrate 105.

The lower separation structure 536b may have an upper end 536Ua of an upper surface that does not overlap or contact the upper separation structure 546b, and a recessed upper surface 536Uc located on a height level lower than that of the upper end 536Ua. In this case, the recessed upper surface 536Uc of the lower separation structure 536b may be in contact with the upper separation structure 546b.

The recessed upper surface 536Uc of the lower separation structure 536b may be located on a level lower than a lower end of a lower extension portion 546Ea.

The upper separation structure 546b may further include a medial lower extension portion 546Eb in contact with the recessed upper surface 536Uc. A lower end of the medial lower extension portion 546Eb (referred to as reference number 536Uc) may be located on a lower level than the lower end of the lower extension portion 546Ea.

Figure 10D:
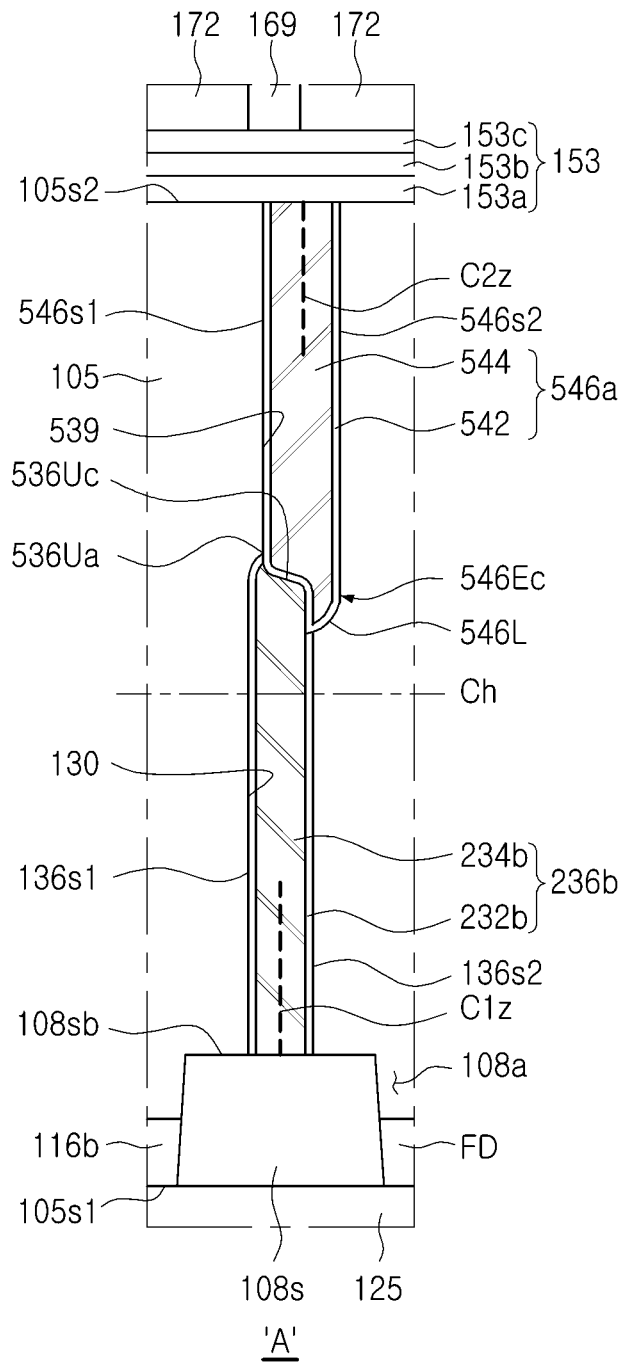

In a modified example, referring to FIG. 10D, the lower extension portion 546E of the upper separation structure 546a in FIG. 10B may be replaced with a lower extension portion 546Ec contacting the lower separation structure 136 as in FIG. 10a. For example, a lower end of the lower extension portion (546E of FIG. 10B) in FIG. 10B may be spaced apart from the lower separation structure 136, and a lower end of the lower extension portion 546Ec in FIG. 10D may be in contact with the lower separation structure 136.

Figure 11A:
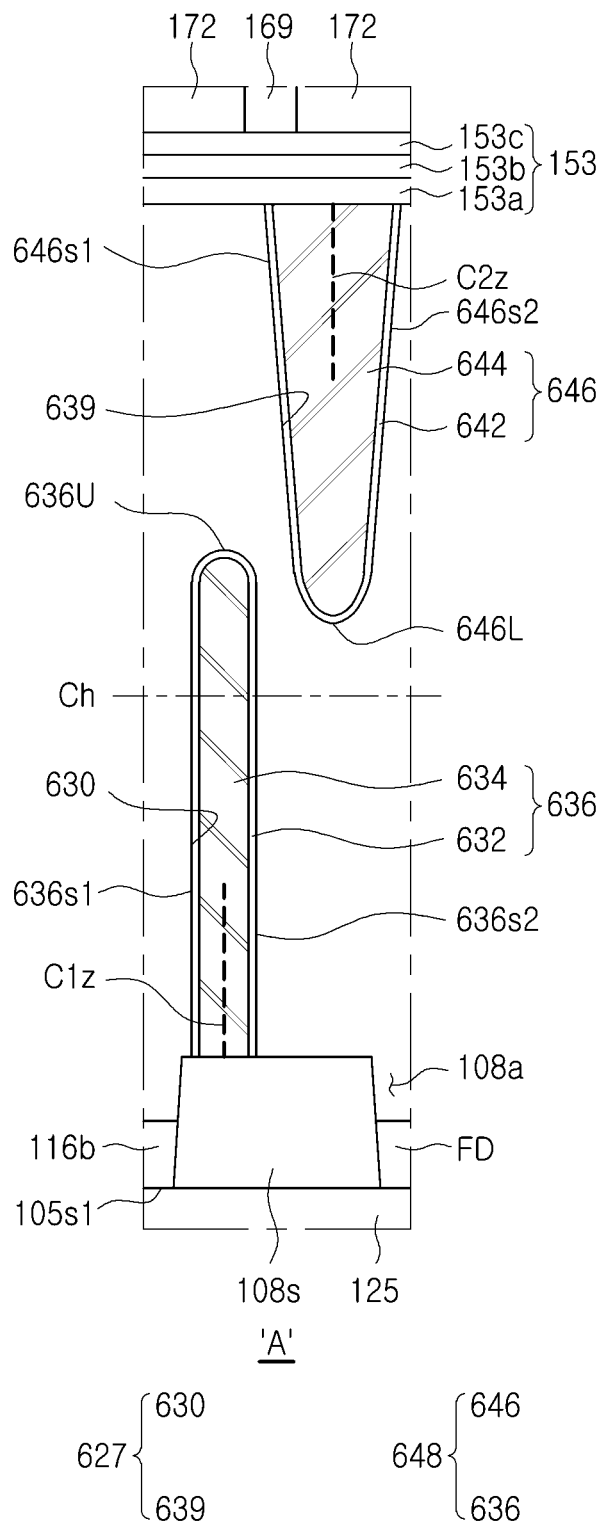

In a modified example, referring to FIG. 11A, the lower separation trench 130 and the upper separation trench 139, connected to each other, in FIG. 2B may be respectively replaced with a lower separation trench 630 and an upper separation trench 639, spaced apart from each other. The first separation structure 148 including the lower separation structure 136 and the upper separation structure 146, contacting each other, in FIG. 2B may be replaced with a first separation structure 648 including a lower separation structure 636 and an upper separation structure 646, spaced apart from each other. The lower separation structure 636 may include a lower material pattern 634 and a lower material layer 632, respectively corresponding to the lower material pattern 134 and the lower material layer 132 described in FIG. 2B. The upper separation structure 646 may include an upper material pattern 644 and an upper material layer 642, respectively corresponding to the upper material pattern 144 and the upper material layer 142 described in FIG. 2B.

A vertical central axis $C1z$ passing through a center between both lateral surfaces 636s1 and 636s2 of the lower separation structure 636 may not be vertically aligned with a central axis $C2z$ passing through a center between both lateral surfaces 646s1 and 646s2 of the upper separation structure 646.

An upper end 636U of the lower separation structure 636 may be located on a higher level than a lower end 646L of the upper separation structure 646. A height difference between the lower end 646L of the upper separation structure 646 and the upper end 636U of the lower separation structure 636 may be greater than a width of the lower separation structure 636.

Figure 11B:
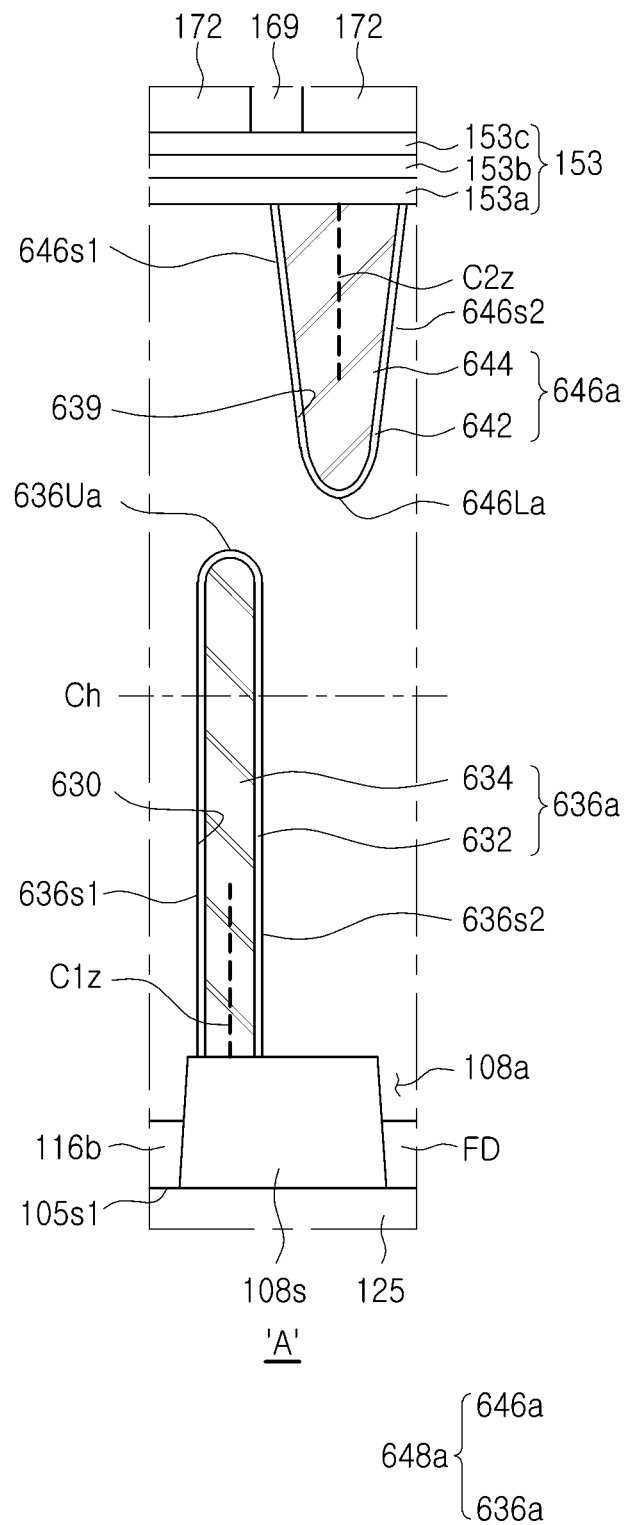

In a modified example, referring to FIG. 11B, the lower separation structure 636 in FIG. 11A may be replaced with a lower separation structure 636a having an upper end 636Ua located on a first height level, and the upper separation structure 646 in FIG. 11A may be replaced with an upper separation structure 646a having a lower end 646La located on a second height level, higher than the first height level.

An upper surface of the lower separation structure 636a may not overlap a lower surface of the upper separation structure 646a.

Figure 11C:
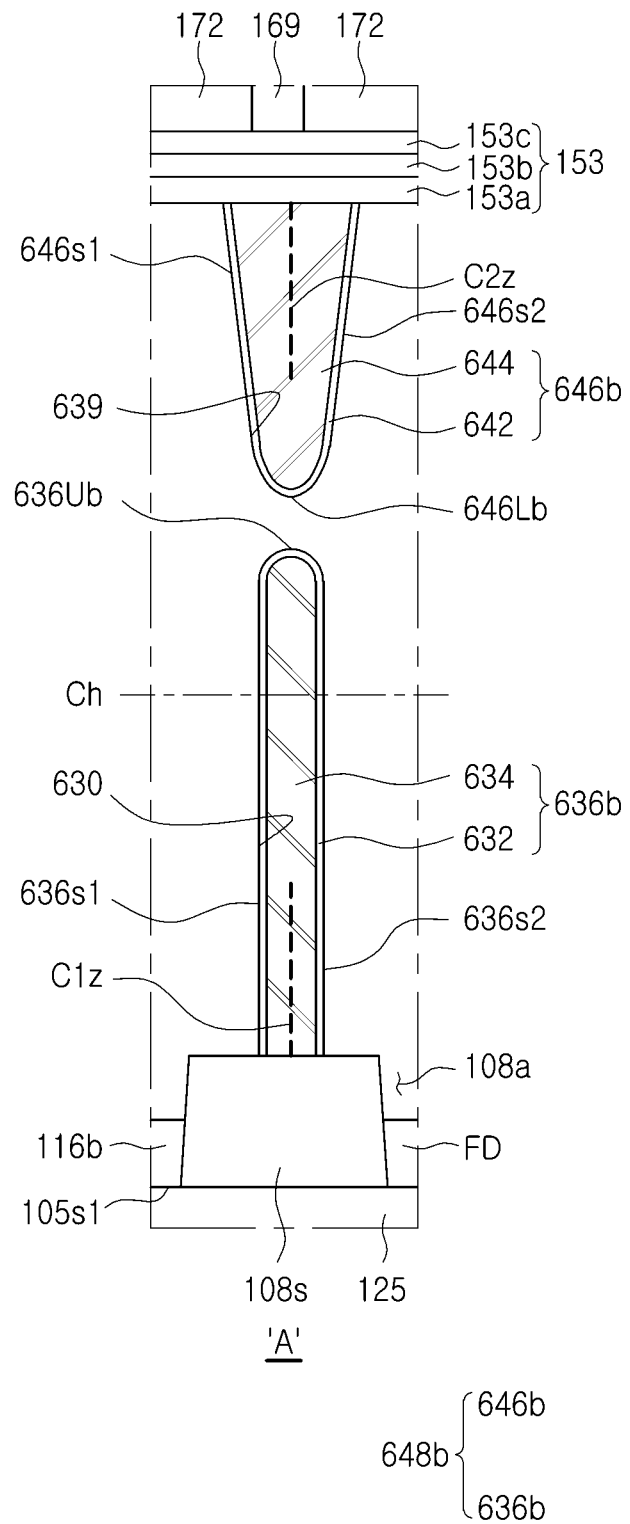

In a modified example, referring to FIG. 11C, the lower separation structure 636a and the upper separation structure 646a, not overlapping each other, in FIG. 11B may be replaced with a lower separation structure 636b and an upper separation structure 646b, vertically overlapping each other. For example, at least a portion of an upper surface of the lower separation structure 636b may overlap at least a portion of a lower surface of the upper separation structure 646b.

Next, referring to FIGS. 12A to 12C, an example of a cross-sectional structure of the optical black region OB of the second region EA of the image sensor 1, an example of a cross-sectional structure of the chip-connection region CB of the second region EA, and an example of a cross-sectional structure of the third region PA will be described. FIG. 12A may illustrate a region of the optical black region OB of the second region EA of the image sensor 1 of FIG. 1, taken along line III-III', FIG. 12B may illustrate a region of the chip-connection region CB of the second region EA of the image sensor 1 of FIG. 1, taken along line IV-IV', and FIG. 12C may illustrate a region of the third region PA of the image sensor 1 of FIG. 1, taken along line V-V'. In the following, in describing the cross-sectional structures of the second region EA and the third region PA of the image sensor 1 with reference to each of FIGS. 12A to 12C, descriptions of components that may be easily understood from the descriptions with reference to FIGS. 1 to 3 will be omitted.

Figure 12A:
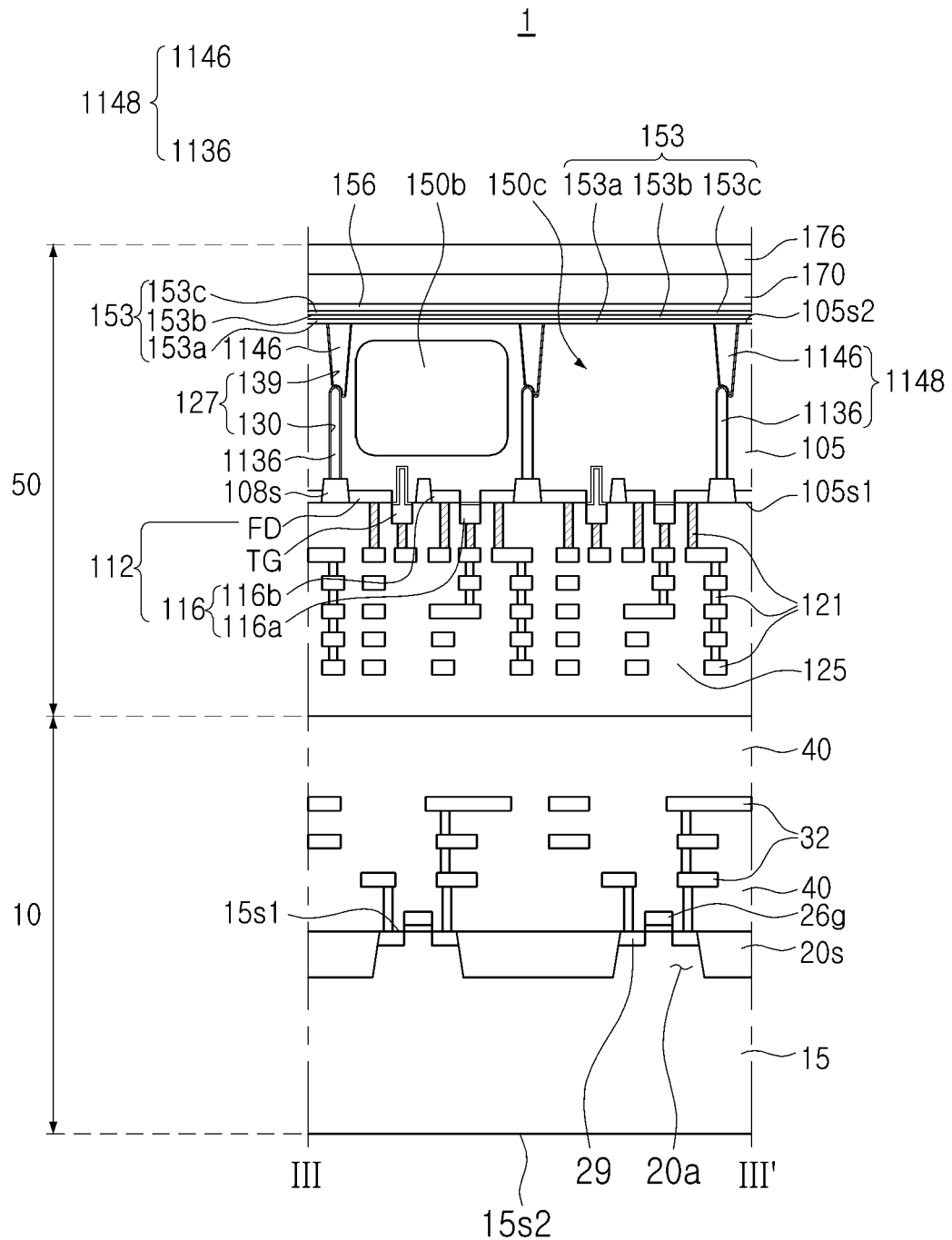
FIGS. 12A to 12C are cross-sectional views schematically illustrating an image sensor according to an embodiment.

First, referring to FIG. 12A, the optical black region OB of the upper chip 50 may include a second separation structure 1148 having substantially the same cross-sectional structure as the first separation structure 148 shown in FIG. 2A. For example, the second separation structure 1148 may include a lower separation structure 1136 and an upper separation structure 1146, respectively corresponding to the lower separation structure 136 and the upper separation structure 146 of the first separation structure 148. The second separation structure 1148 may be modified in the same manner as various modified examples of the first separation structure 148 described in FIGS. 4 to 11C. For example, when the first separation structure 148 is modified to the first separation structure 248a as in FIG. 7B, the second separation structure 1148 may be modified to the same structure as the first separation structure 248a as in FIG. 7B.

In the optical black region OB of the second region EA of the image sensor 1, the upper chip 50 may include the semiconductor substrate 105, and may further include a first reference region 150b and a second reference region 150c, surrounded by the second separation structure 1148.

In an example embodiment, the first reference region 150b may be a region including a photodiode as the photodiode of the first photoelectric region 150a. For example, the first reference region 150b may be identical to the first photoelectric region 150a.

In an example embodiment, the second reference region 150c may be different from the first photoelectric region 150a. For example, the second reference region 150c may be a comparison region that does not include the first photoelectric region 150a or a comparison region that does not include the photodiode of the first photoelectric region 150a.

In the optical black region OB of the second region EA of the image sensor 1, the upper chip 50 may further include a back side insulating layer 153, a light blocking conductive layer 156, a first light blocking color filter layer 170, and an upper capping layer 176, sequentially stacked on the second side 105s2 of the semiconductor substrate 105.

The light blocking conductive layer 156 and the first light blocking color filter layer 170 on the light blocking conductive layer 156 may form a light blocking pattern. The light blocking conductive layer 156 and the first light blocking color filter layer 170 may be layers that block light, and the light blocking conductive layer 156 and the first light blocking color filter layer 170 may effectively block light from entering the first reference region 150b and the second reference region 150c.

In an example embodiment, the light blocking conductive layer 156 may include a metal material. For example, the light blocking conductive layer 156 may include a metal nitride layer (e.g., TiN, WN, etc.) and a metal layer (e.g., W, etc.), sequentially stacked.

In an example embodiment, the first light blocking color filter layer 170 may include a blue color filter layer.

In an embodiment, the optical black region OB may be used to remove a noise signal caused by a dark current. For example, in a state in which light is blocked by the light blocking conductive layer 156 and the first light blocking color filter layer 170, the first reference region 150b including a photodiode may be used as a reference pixel for removal of noise by the photodiode. Also, in a state in which light is blocked by the light blocking conductive layer 156 and the first light blocking color filter layer 170, the second reference region 150c not including a photodiode may a region for checking process noise for noise removal by other components, not the photodiode.

Figure 12B:
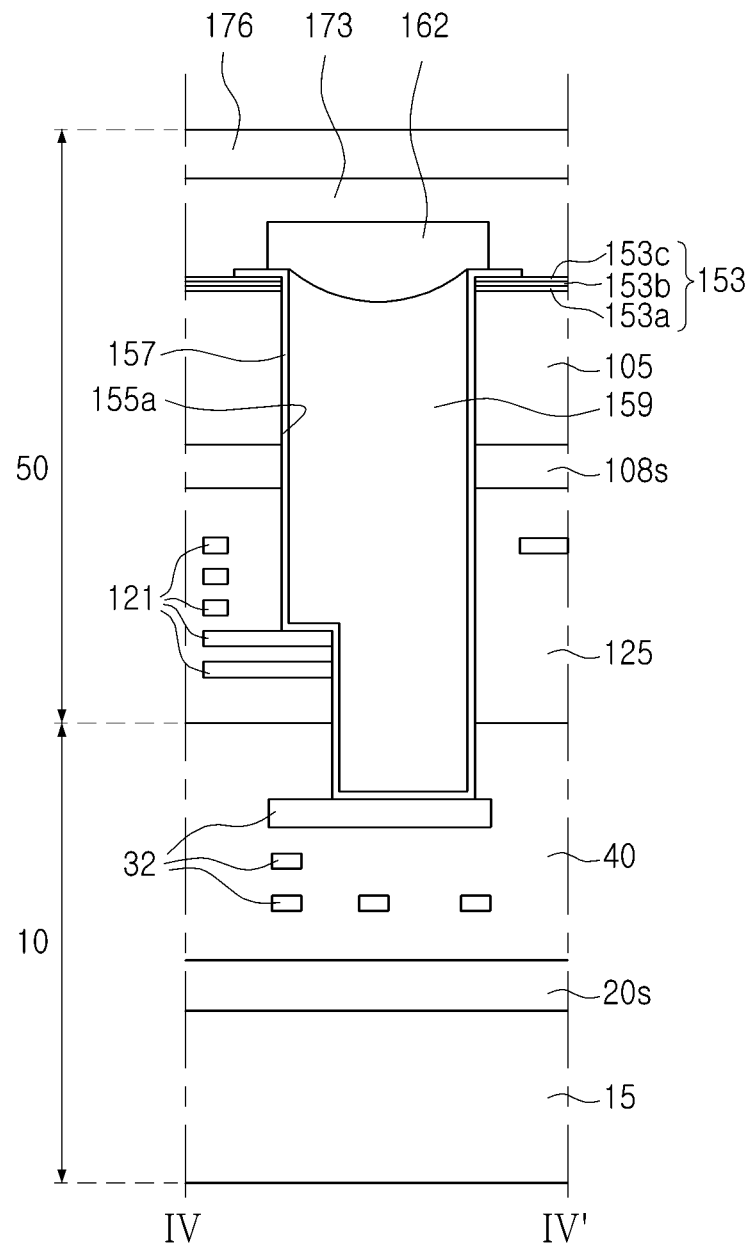
Figure 12C:
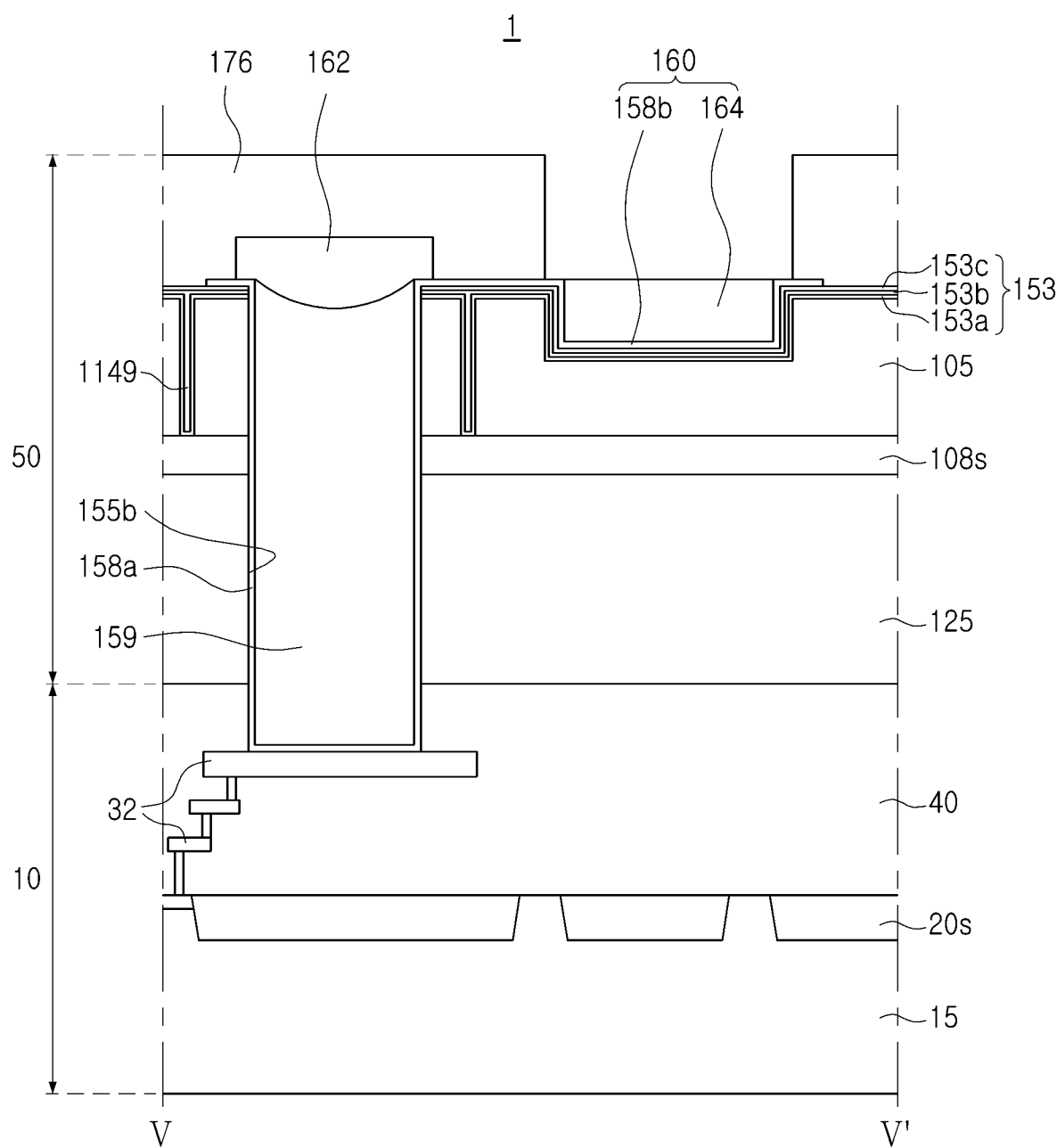

Next, referring to FIGS. 12B and 12C together with FIG. 12A, a first via hole 155a passing through at least a portion of the upper chip 50 in the chip-connection region CB of the second region EA and extending into the lower chip 10, and a second via hole 155b passing through at least a portion of the upper chip 50 in the third region PA and extending into the lower chip 10 may be included.

The first via hole 155a may pass through the back side insulating layer 153 and the semiconductor substrate 105 of the upper chip 50 and may extend in a downward direction, to expose a portion of an upper wiring structure 121 and a portion of a lower wiring structure 32, and the second via hole 155b may pass through the back side insulating layer 153 and the semiconductor substrate 105 of the upper chip 50 and may extend in a downward direction, to expose a portion of the lower wiring structure 32.

The image sensor 1 may include a first connection conductive layer 157 in the first via hole 155a, and a second connection conductive layer 158a in the second via hole 155b.

The first connection conductive layer 157 may electrically connect the upper wiring structure 121 and the lower wiring structure 32 while contacting the upper wiring structure 121 and the lower wiring structure 32. The second connection conductive layer 158a may electrically connect the lower wiring structure 32 while contacting the lower wiring structure 32.

The first connection conductive layer 157 and the second connection conductive layer 158a may be formed of the same material as the light blocking conductive layer 156.

The image sensor 1 may further include a gap-fill insulating layer 159 filling the first via hole 155 and the second via hole 156, respectively, on the first connection conductive layer 157 and the second connection conductive layer 158a, and having a concave upper surface, and a buffer insulating layer 162 covering the gap-fill insulating layer 159 and having an upper surface located on a higher level than an upper surface of the back side insulating layer 153. The buffer insulating layer 162 may include a cured photoresist material.

The image sensor 1 may further include a second light blocking color filter layer 173 covering the buffer insulating layer 162 on the chip-connection region CB in the second region EA. The second light blocking color filter layer 173 on the chip-connection region CB of the second region EA may have a shape extending from the first light blocking color filter layer 170 on the optical black region OB of the second region EA. The first light blocking color filter layer 170 and the second light blocking color filter layer 173 may be made of the same material, and may be, for example, a blue color filter layer.

The image sensor 1 may further include a conductive pad 160 in the third region PA. The conductive pad 160 may include a pad conductive layer 158b extending from the second connection conductive layer 158a, and a conductive pad pattern 164 on the pad conductive layer 158b.

In an example embodiment, at least a portion of the conductive pad 160 may be buried in the semiconductor substrate 105. For example, the conductive pad 160 may have an upper surface located on a level higher than the second side 105s2 of the semiconductor substrate 105, and an upper surface located on a lower level than the second side 105s2 of the semiconductor substrate 105.

In an example embodiment, an insulating layer may be disposed between the conductive pad 160 and the semiconductor substrate 105. The insulating layer disposed between the conductive pad 160 and the semiconductor substrate 105 may include at least a portion of the back side insulating layer 153.

The upper capping layer 176 on the optical black region OB of the second region EA may be extended onto the chip-connection region CB of the second region EA and the third region PA. The upper capping layer 176 may cover the chip-connection region CB of the second region EA, and may cover a remaining portion of the third region PA while exposing the conductive pad 160 on the third region PA.

Figure 13:
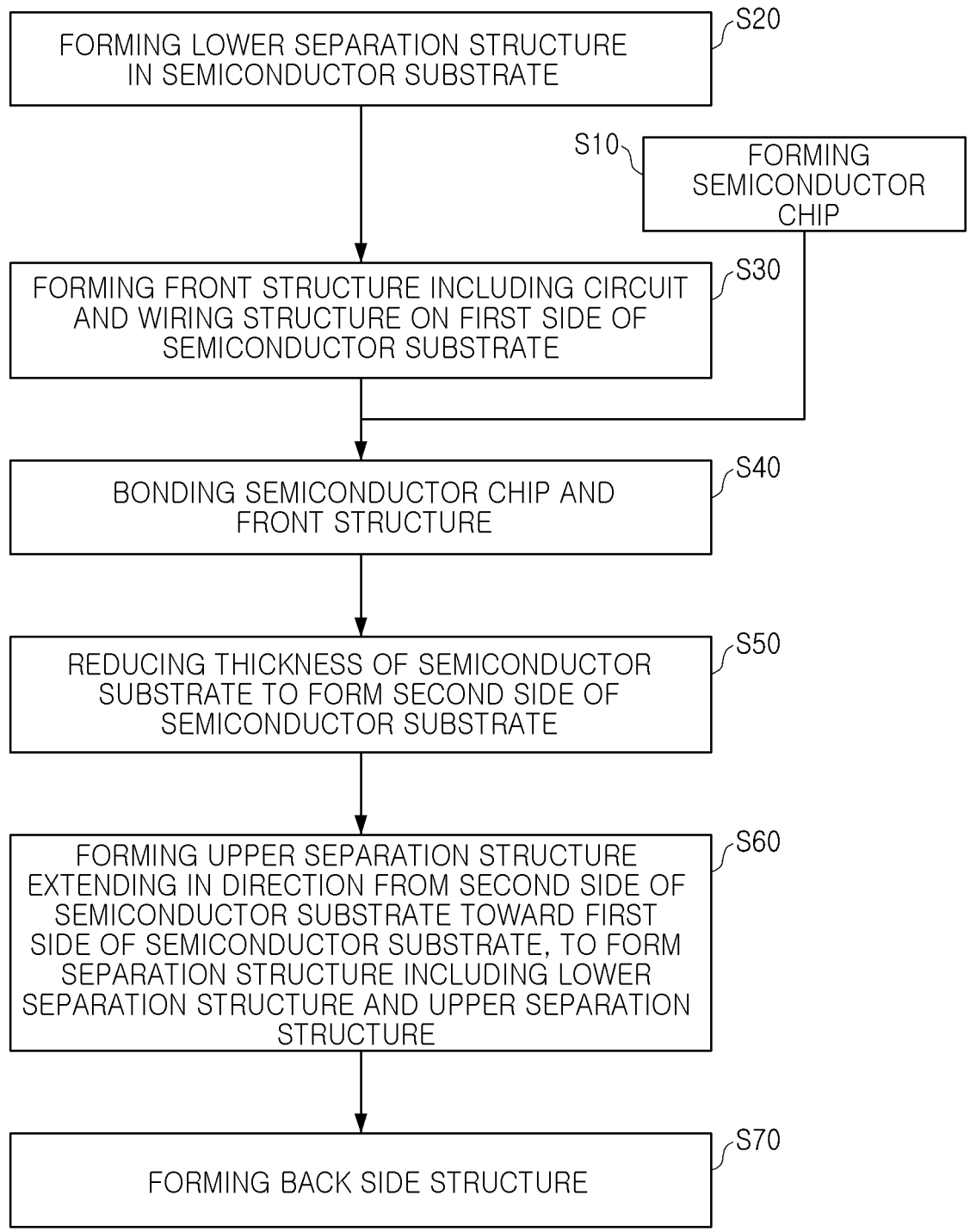
FIG. 13 may be a flowchart schematically illustrating a method of forming an image sensor according to an embodiment.

Next, an example of a method of forming an image sensor 1 will be described with reference to FIG. 13. FIG. 13 may be a flowchart schematically illustrating a method of forming an image sensor 1.

Referring to FIG. 13 along with FIGS. 1, 2A, and 2B, a semiconductor chip may be formed (S10). The semiconductor chip may be the lower chip 10 as illustrated in FIGS. 1, 2A, and 12A to 12C. A lower separation structure may be formed in a semiconductor substrate (S20). In this case, the semiconductor substrate may be the semiconductor substrate 105 in FIG. 2A, and the lower separation structure may be the lower separation structure 136 in FIG. 2A. For example, formation of the lower separation structure 136 may include forming an upper isolation layer 108s on a first side 105s1 of the semiconductor substrate 105, forming a lower separation trench 130 passing through the upper isolation layer 108s and extending into the semiconductor substrate 105, forming a lower material layer 132 covering an inner wall of the lower separation trench 130, forming a lower material pattern 134 filling the lower separation trench 130 on the lower material layer 132, and forming an insulating layer filling a portion of the upper isolation layer 108s passed through. A front structure including a circuit and a wiring structure may be formed on the first side of the semiconductor substrate (S30). The front structure may include the upper device 112, the upper wiring structure 121, and the upper insulating layer 125 in FIG. 2A. The upper device 112 may be a circuit structure. The semiconductor chip and the front structure may be joined (S40). For example, the semiconductor chip as in FIG. 2A, e.g., the lower insulating layer 40 and the upper insulating layer 125 of the lower chip 10 may be joined to each other. A thickness of the semiconductor substrate may be reduced to form a second side of the semiconductor substrate (S50). The second side of the semiconductor substrate may be the second side 105s2 of the semiconductor substrate 105 in FIG. 2A.

An upper separation structure, extending in a direction from the second side of the semiconductor substrate toward the first side of the semiconductor substrate, may be formed to form a separation structure including the lower separation structure and the upper separation structure (S60). The separation structure may be the first separation structure 148 in FIG. 2A and the second separation structure 1148 in FIG. 12A.

A back side structure may be formed (S70). The back side structure in S70 may include the back side insulating layer 150, the filter separation patterns 169, the color filters 172, the microlenses 175, the light blocking conductive layer 156, the first light blocking color filter layer 170, the first connection conductive layer 157 and the second connection conductive layer 158a, the conductive pad 160, and the upper capping layer 176.

According to embodiments, an image sensor including a separation structure disposed between photoelectric regions of a semiconductor substrate may be provided. The separation structure may include a lower separation structure and an upper separation structure on the lower separation structure. The separation structure may be configured to be divided into two (2) separation structures, e.g., the lower separation structures and the upper separation structure, not one (1) separation structure, to further downsize the image sensor.

Various advantages and effects of the present inventive concept are not limited to the above descriptions, and may be more easily understood in the process of describing specific embodiments in the above disclosure.

While example embodiments have been illustrated and described above, it will be apparent to those skilled in the art that modifications and variations could be made without departing from the scope of the inventive concept as defined by the appended claims.

What is claimed is:

1. An image sensor comprising:
   a semiconductor substrate having a first side and a second side opposite to the first side;
   a plurality of photoelectric regions arranged in the semiconductor substrate in a first direction and a second direction, wherein the first direction and the second direction are perpendicular to each other; and
   a separation structure disposed in the semiconductor substrate to separate the plurality of photoelectric regions; and
   an isolation layer disposed into the semiconductor substrate and below the separation structure;
   wherein the separation structure comprises:
     a lower separation structure disposed at the first side of the semiconductor substrate; and
     an upper separation structure disposed at the second side of the semiconductor substrate,
   wherein in at least a portion of the separation structure, a first vertical central axis between both lateral surfaces of the lower separation structure is not vertically aligned with a second vertical central axis between both lateral surfaces of the upper separation structure,
   wherein the separation structure further comprises a linear portion located between the plurality of photoelectric regions and extending in the first direction,
   wherein, in a cross-sectional structure of the linear portion of the separation structure in the first direction, the upper separation structure has a first lateral surface and a second lateral surface, wherein the first and the second lateral surfaces are opposite to each other, and
   wherein the second lateral surface of the upper separation structure comprises a first portion having a positive angle of inclination, a second portion having a negative angle of inclination, and a bent portion disposed between the first portion and the second portion.

2. The image sensor of claim 1, wherein, in the cross-sectional structure of the linear portion of the separation structure in the first direction, an upper surface of the lower separation structure comprises a plurality of first portions having a concave shape.

3. The image sensor of claim 2, wherein at least one of the plurality of first portions is formed at a position wherein a first inclined surface and a second inclined surface of the upper surface of the lower separation structure, having different angles of inclination, meet each other.

4. The image sensor of claim 2, wherein, in the cross-sectional structure of the linear portion of the separation structure in the first direction, the upper surface of the lower separation structure comprises a second portion having a convex shape between a pair of first portions adjacent to each other, among the plurality of first portions, and
   wherein the plurality of first portions each are disposed between the plurality of photoelectric regions adjacent to one another in the second direction.

5. The image sensor of claim 1, wherein the lower separation structure is in contact with the upper separation structure.

6. The image sensor of claim 1,
wherein, in the cross-sectional structure of the linear portion of the separation structure in the first direction, the upper separation structure comprises a portion vertically overlapping the lower separation structure, and a lower extension portion not overlapping the lower separation structure and extending toward the first side of the semiconductor substrate, and
wherein a lower end of the upper separation structure is a lower end of the lower extension portion of the upper separation structure.

7. The image sensor of claim 6, wherein the lower end of the lower extension portion of the upper separation structure is spaced apart from a lateral surface of the lower separation structure overlapping the upper separation structure.

8. The image sensor of claim 1, wherein the first and the second lateral surfaces of the upper separation structure have a first angle of inclination, and
a lateral surface of the lower separation structure has a second angle of inclination, steeper than the first angle of inclination.

9. The image sensor of claim 1,
wherein the lower separation structure comprises a lower material pattern and a lower material layer interposed between the lower material pattern and the semiconductor substrate, and
wherein the lower material pattern comprises a polysilicon material, and the lower material layer comprises an insulating material.

10. The image sensor of claim 9, wherein the upper separation structure is in contact with the lower material pattern.

11. The image sensor of claim 1,
wherein, in the cross-sectional structure of the linear portion of the separation structure in the first direction, at least one of an upper surface of the lower separation structure and a lower surface of the upper separation structure has a wavy shape.

12. The image sensor of claim 11, wherein, when viewed based on a horizontal central axis passing a central portion between the first side of the semiconductor substrate and the second side of the semiconductor substrate, the upper surface of the lower separation structure and the lower surface of the upper separation structure are located on a height level between the horizontal central axis and the second side of the semiconductor substrate.

13. The image sensor of claim 1, wherein a width of the isolation layer is greater than a width of a lower region of the lower separation structure.

14. An image sensor comprising:
a semiconductor substrate having a first side and a second side opposite to the first side;
a plurality of photoelectric regions arranged in the semiconductor substrate in a first direction and a second direction, wherein the first direction and the second direction are perpendicular to each other; and
a separation structure disposed in the semiconductor substrate to separate the plurality of photoelectric regions,
wherein the separation structure comprises a lower separation structure disposed at the first side of the semiconductor substrate and an upper separation structure disposed at the second side of the semiconductor substrate,
wherein an upper end of the upper separation structure is coplanar with the second side of the semiconductor substrate,
wherein in at least a portion of the separation structure, a first vertical central axis between both lateral surfaces of the lower separation structure is not vertically aligned with a second vertical central axis between both lateral surfaces of the upper separation structure,
wherein the separation structure further comprises a linear portion located between the plurality of photoelectric regions and extending in the first direction,
wherein, in a cross-sectional structure of the linear portion of the separation structure in the first direction, the upper separation structure has a first lateral surface and a second lateral surface, wherein the first and the second lateral surfaces are opposite to each other,
wherein the first lateral surface of the upper separation structure overlaps the lower separation structure, and the second lateral surface of the upper separation structure does not overlap the lower separation structure, and
wherein the second lateral surface of the upper separation structure comprises a first portion having a positive angle of inclination, a second portion having a negative angle of inclination, and a bent portion disposed between the first portion and the second portion.

15. The image sensor of claim 14, wherein, on the second lateral surface of the upper separation structure, the bent portion is located on a height level between a lower end of the upper separation structure and an upper end of the lower separation structure.

16. An image sensor comprising:
a first chip structure comprising a lower substrate, a lower wiring structure disposed above the lower substrate, and a lower insulating layer disposed above the lower substrate and covering the lower wiring structure; and
a second chip structure disposed above the first chip structure,
wherein the second chip structure comprises:
a semiconductor substrate having a first side opposing the first chip structure and a second side opposite to the first side;
a plurality of photoelectric regions arranged in a first region of the semiconductor substrate in a first direction and a second direction, perpendicular to each other;
a first reference region and a second reference region, disposed in a second region of the semiconductor substrate and spaced apart from each other;
a back side insulating layer disposed above the second side of the semiconductor substrate;
color filters disposed above the back side insulating layer and overlapping the plurality of photoelectric regions;
microlenses disposed above the color filters;
a light blocking pattern disposed above the back side insulating layer and overlapping the first reference region and the second reference region;
a first separation structure disposed in a first separation trench structure in the first region of the semiconductor substrate and surrounding each of the plurality of photoelectric regions;
a second separation structure disposed in a second separation trench structure in the second region of the semiconductor substrate and surrounding each of the first reference region and the second reference region;
an isolation layer disposed into the semiconductor substrate and below the first and the second separation structures; and an upper wiring structure and an upper insulating layer, disposed between the first side of the semiconductor substrate and the first chip structure, wherein each of the first and the second separation trench structures comprises:
 a lower separation trench upwardly extending from the isolation layer; and
 an upper separation trench downwardly extending from the second side of the semiconductor substrate, wherein each of the first separation structure and the second separation structure comprises:
 a lower separation structure in the lower separation trench; and
 an upper separation structure in the upper separation trench, wherein the first separation structure comprises a linear portion located between the plurality of photoelectric regions and extending in the first direction, wherein, in a cross-sectional structure of the linear portion of the first separation structure in the first direction, the upper separation structure has a first lateral surface and a second lateral surface, wherein the first and the second lateral surfaces are opposite to each other, and wherein the second lateral surface of the upper separation structure comprises a first portion having a positive angle of inclination, a second portion having a negative angle of inclination, and a bent portion disposed between the first portion and the second portion.

17. The image sensor of claim 16, further comprising:
a first via hole passing through the back side insulating layer and the semiconductor substrate and extending in a downward direction to expose a portion of the upper wiring structure and a portion of the lower wiring structure;

a second via hole passing through the back side insulating layer and the semiconductor substrate and extending in the downward direction to expose a portion of the lower wiring structure;

a first connection conductive layer disposed in the first via hole and electrically connected to the upper wiring structure and the lower wiring structure;

a second connection conductive layer disposed in the second via hole and electrically connected to the lower wiring structure; and an input/output pad comprising a pad conductive layer extending from the second connection conductive layer, and a conductive pattern disposed above the pad conductive layer, wherein the light blocking pattern comprises a light blocking conductive layer and a light blocking color filter layer disposed above the light blocking conductive layer, wherein the first connection conductive layer, the second connection conductive layer and the light blocking conductive layer comprise a same conductive material, wherein the light blocking color filter layer comprises a blue color filter layer, wherein the first reference region and the plurality of photoelectric regions comprise a photodiode, and wherein the second reference region does not include the photodiode.

* * * * *